(12) United States Patent
Park et al.

(10) Patent No.: US 12,412,767 B2
(45) Date of Patent: Sep. 9, 2025

(54) APPARATUS FOR TREATING SUBSTRATE AND METHOD FOR TREATING SUBSTRATE

(71) Applicant: SEMES CO., LTD., Chungcheongnam-do (KR)

(72) Inventors: Gui Su Park, Chungcheongnam-do (KR); Jun Young Choi, Chungcheongbuk-do (KR); Young Jin Jang, Chungcheongnam-do (KR); Yong Sun Ko, Gyeonggi-do (KR); Kyu Hwan Chang, Chungcheongnam-do (KR); Jun Hyun Lim, Seoul (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 396 days.

(21) Appl. No.: 17/980,995

(22) Filed: Nov. 4, 2022

(65) Prior Publication Data
US 2023/0147919 A1 May 11, 2023

(51) Int. Cl.
| | |
|---|---|
| H01L 21/67 | (2006.01) |
| B08B 3/08 | (2006.01) |
| B08B 13/00 | (2006.01) |
| F26B 5/00 | (2006.01) |
| G03F 7/20 | (2006.01) |
| H01L 21/677 | (2006.01) |
| H01L 21/687 | (2006.01) |
| B25J 11/00 | (2006.01) |

(52) U.S. Cl.
CPC .......... *H01L 21/67718* (2013.01); *B08B 3/08* (2013.01); *B08B 13/00* (2013.01); *F26B 5/005* (2013.01); *G03F 7/2043* (2013.01); *H01L 21/68707* (2013.01); *B25J 11/0095* (2013.01)

(58) Field of Classification Search
CPC ................................................. H01L 21/67063
See application file for complete search history.

(56) References Cited

U.S. PATENT DOCUMENTS

2018/0090358 A1* 3/2018 Miyamoto ........ H01L 21/67288

FOREIGN PATENT DOCUMENTS

| JP | 2012-146862 A | 8/2012 |
|---|---|---|
| KR | 10-0761576 B1 | 9/2007 |

(Continued)

OTHER PUBLICATIONS

Korean Office Action issued in corresponding KR Patent Application No. 10-2021-0150990, dated Jul. 31, 2023, with English translation.

(Continued)

*Primary Examiner* — Jason Y Ko
(74) *Attorney, Agent, or Firm* — Carter, DeLuca & Farrell LLP

(57) ABSTRACT

The inventive concept provides a substrate treating apparatus. The substrate treating apparatus includes a first process treating unit configured to treat a substrate in a single-type method; a second process treating unit configured to treat a substrate in a batch-type method; and a posture changing unit provided between the first process treating unit and the second process treating unit and configured to change a posture of the substrate between a vertical posture and a horizontal posture, and wherein the substrate is loaded to and unloaded from the first process treating unit.

20 Claims, 20 Drawing Sheets

(56) References Cited

FOREIGN PATENT DOCUMENTS

| KR | 10-2011-0002419 A | 1/2011 |
| KR | 10-2013-0031048 A | 3/2013 |
| KR | 10-2020-0060280 A | 5/2020 |
| KR | 10-2021-0043445 A | 4/2021 |

OTHER PUBLICATIONS

Korean Office Action issued in corresponding KR Patent Application No. 10-2021-0150990, dated Aug. 30, 2024, with English translation.

* cited by examiner

APPARATUS FOR TREATING SUBSTRATE AND METHOD FOR TREATING SUBSTRATE

CROSS-REFERENCE TO RELATED APPLICATIONS

A claim for priority under 35 U.S.C. § 119 is made to Korean Patent Application No. 10-2021-0150990 filed on Nov. 5, 2021, in the Korean Intellectual Property Office, the entire contents of which are hereby incorporated by reference.

BACKGROUND

Embodiments of the inventive concept described herein relate to a substrate treating apparatus and a substrate treating method.

In order to manufacture a semiconductor element, a desired pattern is formed on a substrate such as a wafer through various processes such as a photolithography process, an etching process, an ashing process, an ion implantation process, and a thin film deposition process on the substrate. Various treating liquids and treating gases are used in each process, and particles and process by-products are generated during a process. In order to remove a thin film, particles, and process by-products on the substrate from the substrate, a liquid treatment process is performed on the substrate before and after each process. In a general liquid treatment process, the substrate is treated with a chemical and a rinsing liquid and then dried. In the liquid treatment process, a SiN on the substrate may be stripped.

In addition, a substrate treating method using a treating liquid such as a chemical and/or a rinsing liquid can be divided into a batch-type treating method of treating a plurality of substrates in batches and a single-type treating method of treating substrates one by one.

In the batch-type treating method for collectively treating the plurality of substrates, a substrate treatment is performed by collectively immersing the plurality of substrates in a vertical posture in a treating bath in which a chemical or a rinsing liquid is stored. For this reason, a mass productivity of the substrate treatment is excellent, and a treating quality between each substrate is uniform. In the batch-type treating method, a plurality of substrates having a pattern formed on a top surface are immersed in the vertical posture. Accordingly, if the pattern formed on the substrate has a high aspect ratio, a pattern learning phenomenon may occur at the pattern formed on the substrate during a process such as lifting the substrate. In addition, if a drying treatment is not quickly performed within a short period of time in a state in which the plurality of substrates are exposed to the air, a water mark may be generated in some of the plurality of substrates exposed to the air.

On the other hand, in the case of the single-type treating method of treating substrates one by one, a substrate treatment is performed to supply a chemical or a rinsing liquid to a single substrate rotating in a horizontal posture. Also, in the single-type treating method, since a transferred substrate maintains the horizontal posture, a risk of the pattern leaning phenomenon is reduced, and the substrate is treated one by one and a treated substrate is immediately dried or liquid-treated, so a risk of the water mark is reduced. However, in the case of the single-type treating method, the mass productivity of the substrate treatment is poor, and the treating quality between each substrate is relatively uneven compared to the batch-type treating method.

In addition, if the substrate is spin-dried by a rotation, if the pattern formed on the substrate has the high aspect ratio, there is a concern that a leaning phenomenon, in which the pattern formed on the substrate collapses, may occur.

SUMMARY

Embodiments of the inventive concept provide a substrate treating apparatus and method for efficiently treating a substrate.

Embodiments of the inventive concept provide a substrate treating apparatus and method for improving a mass productivity of a substrate treating.

Embodiments of the inventive concept provide a substrate treating apparatus and method for improving a uniformity of a treatment quality between each substrate.

Embodiments of the inventive concept provide a substrate treating apparatus and method for minimizing a risk of generating a water mark on a substrate.

Embodiments of the inventive concept provide a substrate treating apparatus and method for minimizing a generation of a leaning phenomenon of a pattern formed on a substrate.

Embodiments of the inventive concept provide a substrate treating apparatus and method for efficiently treating a substrate at which a pattern with a high aspect ratio is formed.

Embodiments of the inventive concept provide a substrate treating apparatus and method for minimizing a generation of a fume and reducing a size of an apparatus to increase a space utilization.

The technical objectives of the inventive concept are not limited to the above-mentioned ones, and the other unmentioned technical objects will become apparent to those skilled in the art from the following description.

The inventive concept provides a substrate treating apparatus. The substrate treating apparatus includes a first process treating unit configured to treat a substrate in a single-type method; a second process treating unit configured to treat a substrate in a batch-type method; and a posture changing unit provided between the first process treating unit and the second process treating unit and configured to change a posture of the substrate between a vertical posture and a horizontal posture, and wherein the substrate is loaded to and unloaded from the first process treating unit.

In an embodiment, the posture changing unit includes: a posture changing robot for changing the posture of the substrate between the vertical posture and the horizontal posture; a posture changing treating bath having a storage space for storing the substrate; and a support member positioned within the storage space of the posture changing treating bath and which supports the substrate which has its posture changed by the posture changing robot in the vertical posture.

In an embodiment, the first process treating unit includes: a liquid treating unit configured to treat the substrate in the single-type method by supplying a first treating liquid to the substrate in the horizontal posture; and a buffer unit configured to store the substrate which has been treated at the liquid treating unit in the horizontal posture.

In an embodiment, the posture changing robot moves between the buffer unit and the posture changing treating bath, and the posture changing robot changes the substrate which is stored at the buffer unit in the horizontal posture to the vertical posture to transfer to the posture changing treating bath, and changes the substrate which is stored at the posture changing treating bath in the vertical posture to the horizontal posture to transfer to the buffer unit.

In an embodiment, the second process treating unit includes: a plurality of batch-type treating baths for batch-type treating the substrate; and a transfer unit configured to transfer the substrate between the posture changing treating bath and the plurality of batch-type treating baths.

In an embodiment, the plurality of batch-type treating baths include: a first batch-type treating bath for batch-type treating the substrate by supplying a second treating liquid to the substrate; and a second batch-type treating bath for batch-type treating the substrate by supplying a third treating liquid to the substrate.

In an embodiment, the first process treating unit includes: an organic solvent treating unit configured to single-type treat the substrate by supplying an organic solvent to the substrate; a supercritical treating unit configured to single-type treat the substrate by supplying a drying fluid to the substrate; and a transfer treating unit configured to transfer the substrate between the buffer unit, the liquid treating unit, the organic solvent treating unit, and the dry treating unit.

In an embodiment, the first process treating unit includes a load port unit configured to include a plurality of load ports, and a portion of the plurality of load ports are provided as a first load port unit at which the substrate is loaded in the horizontal posture, and the other portion of the plurality of load ports are provided as a second load port unit at which the substrate is unloaded in the horizontal posture.

In an embodiment, the posture changing robot includes: a hand which is configured to hold the substrate; and an arm which moves the hand.

In an embodiment, the substrate treating apparatus further includes a controller, and wherein the controller controls the substrate to sequentially perform: a substrate loading step for loading the substrate to the load port of the first process treating unit in the horizontal posture; a first single-type treating step for treating the substrate at the liquid treating unit of the first process treating unit in the horizontal posture; a first posture changing step for changing the posture of the substrate from the horizontal posture to the vertical posture; a batch-type treating step for treating the substrate at the second process treating unit in the vertical posture; a second posture changing step for changing the posture of the substrate from the vertical posture to the horizontal posture; a second single-type treating step for treating the substrate at the first process treating unit in the horizontal posture; and a substrate unloading step for unloading the substrate to the load port of the first process treating unit in the horizontal posture.

The inventive concept provides a substrate treating apparatus. The substrate treating apparatus includes a first process treating unit configured to treat a substrate in a single-type method; a second process treating unit configured to treat a substrate in a batch-type method; a third process treating unit configured to treat a substrate in a single-type method; a first posture changing unit provided between the first process treating unit and the second process treating unit and which is configured to change a posture of the substrate between a vertical posture and a horizontal posture; and a second posture changing unit provided between the second process treating unit and the third process treating unit and which is configured to change a posture of the substrate between the vertical posture and the horizontal posture, and wherein the second process treating unit is provided between the first process treating unit and the third process treating unit, and the substrate is provided to be loaded and unloaded in a single-type method.

In an embodiment, the substrate is loaded to the first process treating unit, and the substrate is unloaded by the second process treating unit.

In an embodiment, the first process treating unit includes: a first load port unit configured to include a plurality of load ports at which the substrate is loaded in the horizontal posture; a liquid treating unit configured to single-type treat the substrate in the horizontal posture by supplying a first treating liquid to the substrate; and a first buffer unit configured to store a substrate which has been treated at the liquid treating unit in the horizontal posture, and wherein the third process treating unit includes: an organic solvent treating unit configured to single-type treat the substrate in the horizontal posture by supplying an organic solvent to the substrate; a dry treating unit configured to single-type treat the substrate in the horizontal posture by supplying a drying fluid to the substrate; and a second buffer unit configured to store the substrate which has been single-type treated at the organic solvent treating unit and the dry treating unit in the horizontal posture.

In an embodiment, the first posture changing unit includes: a first posture changing robot for changing the posture of the substrate between the vertical posture and the horizontal posture; a first posture changing treating bath having a storage space for storing the substrate; and a first support member positioned within the storage space of the first posture changing treating bath and which supports the substrate which has its posture changed by the first posture changing robot in the vertical posture, and wherein the first posture changing robot changes the substrate stored at the first buffer unit in the horizontal posture to the vertical posture to transfer to the first posture changing treating bath.

In an embodiment, the second posture changing unit includes: a second posture changing robot for changing the posture of the substrate between the vertical posture and the horizontal posture; a second posture changing treating bath having a storage space for storing the substrate; and a second support member positioned within the storage space of the second posture changing treating bath and which supports the substrate which has its posture changed by the second posture changing robot in the vertical posture, and wherein the second posture changing robot changes the substrate stored at the second posture changing treating bath in the vertical posture to the horizontal posture to transfer to the second buffer unit.

In an embodiment, the second process treating unit includes: a plurality of batch-type treating baths for batch-type treating the substrate; and a transfer unit configured to transfer the substrate between the first posture changing treating bath, the second posture changing treating bath, and the plurality of batch-type treating baths, and wherein the plurality of batch-type treating baths include: a first batch-type treating bath for batch-type treating the substrate by supplying a second treating liquid to the substrate; and a second batch-type treating bath for batch-type treating the substrate by supplying a third treating liquid to the substrate.

In an embodiment, the first posture changing unit includes a first posture changing robot which changes the posture of the substrate from the horizontal posture to the vertical posture, and the second posture changing unit includes a second posture changing robot which changes the posture of the substrate from the vertical posture to the horizontal posture, and wherein the first posture changing robot and the second posture changing robot each include: a hand which is configured to hold the substrate; and an arm which moves the hand.

In an embodiment, the substrate treating apparatus further includes a controller, and wherein the controller controls the substrate to sequentially perform: a substrate loading step for loading the substrate to a load port of the first process treating unit in the horizontal posture; a first single-type treating step for treating the substrate at the first process treating unit in the horizontal posture; a first posture changing step for changing the posture of the substrate from the horizontal posture to the vertical posture; a batch-type treating step for treating the substrate at the second process treating unit in the vertical posture; a second posture changing step for changing the posture of the substrate from the vertical posture to the horizontal posture; a second single-type treating step for treating the substrate at the third process treating unit in the horizontal posture; and a substrate unloading step for unloading the substrate to a load port of the third process treating unit in the horizontal posture.

In an embodiment, the vertical posture refers to a posture at which a top surface or a bottom surface of the substrate is parallel to a direction perpendicular to the ground, and the horizontal posture refers to a posture at which the top surface or the bottom surface of the substrate is parallel to the ground.

In an embodiment, the first treating liquid is a removing liquid for removing an oxide film on the substrate, the second treating liquid is a chemical for removing a contaminant remaining on the substrate, and the third treating liquid is a pure water.

According to an embodiment of the inventive concept, a substrate may be efficiently treated.

According to an embodiment of the inventive concept, a mass productivity of a substrate treating may be improved.

According to an embodiment of the inventive concept, a uniformity of a treatment quality between each substrate may be improved.

According to an embodiment of the inventive concept, a risk of generating a water mark on a substrate may be minimized.

According to an embodiment of the inventive concept, a leaning phenomenon of a pattern formed on a substrate may be minimized.

According to an embodiment of the inventive concept, a substrate at which a pattern with a high aspect ratio is formed may be efficiently treated.

According to an embodiment of the inventive concept, a generation of a fume may be minimized and a size of an apparatus may be reduced to increase a space utilization of an apparatus.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
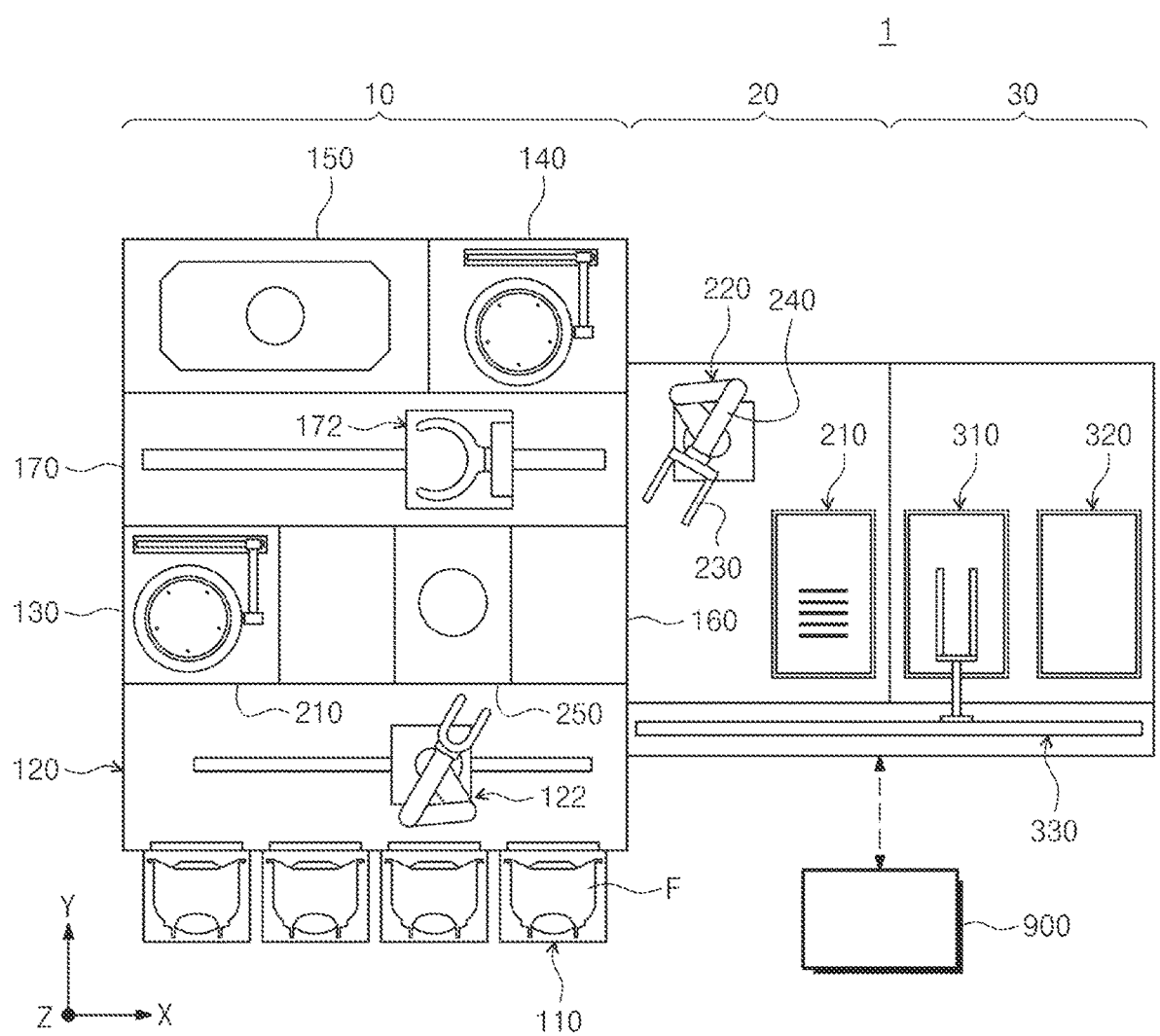
FIG. 1 is a schematic top view of a substrate treating apparatus according to an embodiment of the inventive concept.

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises", "comprising,", "includes", and/or "including" when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "example" is intended to refer to an example or illustration.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

It should be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Other terms such as "between", "adjacent", "near" or the like should be interpreted in the same way.

Unless otherwise defined, all terms used herein, including technical or scientific terms, have the same meaning as those generally understood by those skilled in the art to which the inventive concept belongs. Terms such as those defined in commonly used dictionaries should be interpreted as consistent with the context of the relevant technology and not as ideal or excessively formal unless clearly defined in this application.

In addition, components that transfer the substrate W described below, for example, the following transfer unit or transfer robots, may be referred to as a transfer module.

Hereinafter, an embodiment of the inventive concept will be described with reference to FIG. 1 to FIG. 22.

FIG. 1 is a schematic top view of a substrate treating apparatus according to an embodiment of the inventive concept.

Referring to FIG. 1, a substrate treating apparatus 1 according to an embodiment of the inventive concept may include a first process treating unit 10, a posture changing unit 20, a second process treating unit 30, and a controller 900. The first process treating unit 10 and the second process treating unit 30 may be arranged along a first direction X when viewed from above. Hereinafter, when viewed from above, a direction perpendicular to the first direction X is referred to as a second direction Y, and a direction perpendicular to the first direction X and the second direction Y is referred to as a third direction Z.

The first process treating unit 10 may treat the substrate W in a single-type method. The first process treating unit 10 may load or unload the substrate W in a horizontal posture. The first process treating unit 10 may treat the substrate W in a horizontal posture. The first process treating unit 10 may include a load port unit 110, an index unit 120, an organic solvent treating unit 140, a dry treating unit 150, a buffer unit 160, and a transfer treating unit 170. The load port unit 110 and the index unit 120 may be referred to as an index module, and the liquid treating unit 130, the organic solvent treating unit 140, the dry treating unit 150, the buffer unit 160, and the transfer treating unit 170 are referred to as a process module.

The load port unit 110 may include a plurality of load ports. A transfer container F in which at least one substrate W is stored may be placed on the load ports of the load port unit 110. The plurality of substrates W may be stored at the transfer container F. For example, 25 substrates may be stored at the transfer container F. The transfer container F may be referred to as a cassette, a pod, a FOUP, or the like. The transfer container F may be loaded and unloaded on the load port unit 110 by a container transfer apparatus.

The substrates W stored at the transfer container F placed in a portion of the plurality of load port units 110 may be untreated substrates W. An untreated substrate W may be, for example, a substrate W on which a treatment has not been taken out, or substrates W on which some treatment has been taken out but a liquid treatment is required. The substrates W stored in the transfer container F placed in the remaining portion of the plurality of load ports may be substrates W treated by the first process treating unit 10 and the second process treating unit 30. In other words, a portion of the plurality of load ports may serve to load the substrate W which requires a treatment, and the remaining portion of the plurality of load ports may serve to unload the treated substrate W from the substrate treating apparatus 1. For example, referring to FIG. 1, the load port unit 110 may include four load ports, two of the four load ports may be provided with a first load port unit in which the untreated substrate W is loaded, and the other two load ports may be provided as a second load port unit in which the treated substrate W is unloaded. Although the number of load ports is illustrated as four in this specification, the number is not limited thereto, and may be provided in various numbers according to conditions such as a process efficiency or a footprint.

In addition, only a container F in which the untreated substrate W is stored may be placed in the load port unit 110. That is, the load port unit 110 may perform only a role of which a substrate W requiring a treatment is loaded.

The load port unit 110 may be coupled to the index unit 120. The index unit 120 and the load port unit 110 may be arranged along the second direction Y. The first index unit 120 may include an index robot 122. The index robot 122 may take out the untreated substrate W or the substrate requiring a treatment from a container F mounted on the load port unit 110. The index robot 122 may take out the substrate W from the container F and into the process module. The index robot 122 may take the substrate W out of the container F and transfer the substrate W to the liquid treating unit 130 or the buffer unit 160 to be described later among the process module. The index robot 122 may transfer the substrate W which a treatment has been completed to the container F mounted on the load port unit 110. The index robot may transfer the substrate W which a treatment has been completed and which is stored at the buffer unit 160 to the container F placed on the load port. The index robot 122 may take the treated substrate W to the container F which is placed on the load port included in the second load port unit among the load port unit 110. The container may be transferred to outside of the substrate treating apparatus 1 by an article transfer apparatus (for example, an OHT).

The index robot 122 may have a hand capable of holding and transferring the substrate W. The index robot 122 may have a plurality of hands, of which a portion may be used only to take the substrate W out of the container F and transfer it to the process module, and the other portion may be used only to transfer the treated substrate W from the process module to the container F. The hand of the index robot 122 may be a single-type hand for transferring the substrate W one by one. The hand of the index robot 122 may be provided to be movable along the first direction X, the second direction Y, and the third direction Z. In addition, the hand of the index robot 122 may be provided rotatable with the third direction Z as a rotation axis.

Figure 2:
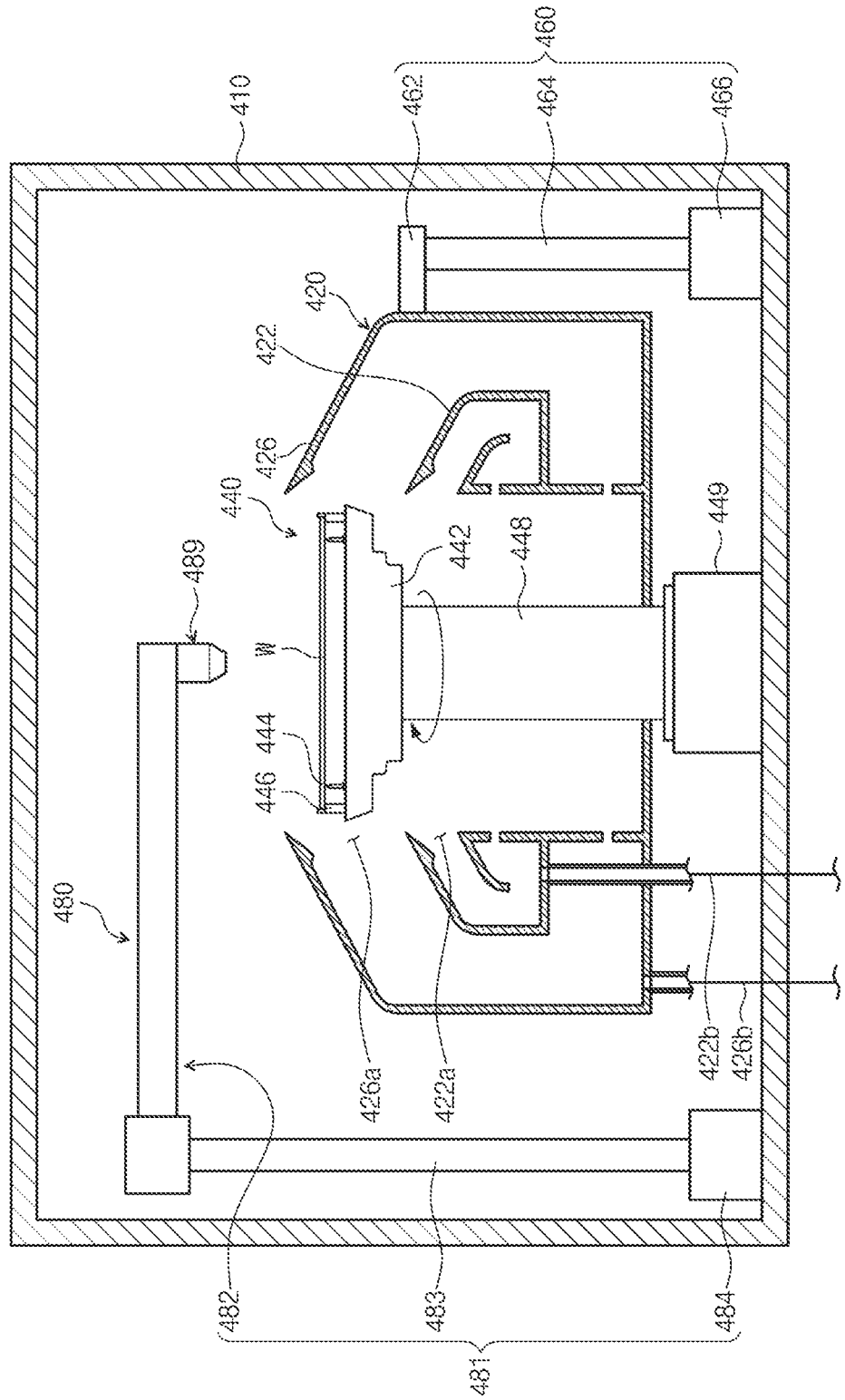
FIG. 2 illustrates a substrate treating apparatus provided to a single-type liquid treating chamber of FIG. 1.

FIG. 2 illustrates a state of a substrate treating apparatus provided in the single-type liquid treating chamber of FIG. 1.

Referring to FIG. 2, the liquid treating unit 130 may treat the substrate in a single-type method. A plurality of liquid treating units 130 may be provided. A plurality of liquid treating units 130 may be provided and stacked in the vertical direction. The liquid treating unit 130 may rotate the substrate W in a horizontal posture, but may supply the first treating liquid to the rotating substrate W to treat the substrate W. The liquid treating unit 130 may treat the substrate W one by one. The first treating liquid supplied from the liquid treating unit 130 may be provided as a treating liquid capable of etching the oxide film on the substrate W. For example, the first treating liquid supplied from the liquid treating unit 130 may be a dilute hydrofluoric acid (DHF). The liquid treating unit 130 may supply the first treating liquid to the rotating substrate W, and may rotate the substrate W to treat the substrate W.

A substrate treating apparatus 400 may be provided to perform a single-type liquid treatment at the liquid treating unit 130. The substrate treating apparatus 400 may include a housing 410, a treating container 420, a support unit 440, a lifting/lowering unit 460, and a liquid supply unit 480.

The housing 410 has a treating space 412 therein. The housing 410 may have a cylindrical shape having a space therein. The inner space 412 of the housing 410 may be provided with a treating container 420, a support unit 440, a lifting/lowering unit 460, and a liquid supply unit 480. The housing 410 may have a rectangular shape when viewed from a front surface. However, the inventive concept is not limited thereto, and the housing 410 may be transformed into various shapes that may have a treating space 412.

The treating container 420 has a cylindrical shape with an open top. The treating container 420 has an inner recollecting container 422 and an outer recollecting container 426. Each of the recollecting containers 422 and 426 recollects different treating liquids among the treating liquids used in a process. The inner recollecting container 422 is provided in an annular ring shape surrounding the support unit 440, and the outer recollecting container 426 is provided in an annular ring shape surrounding the inner recollecting container 426. An inner space 422a of the inner recollecting container 422 and the inner recollecting container 422 function as a first inlet 422a through which the treating liquid flows into the inner recollecting container 422. A space 426a between the inner recollecting container 422 and the outer recollecting container 426 functions as a second inlet 426a through which the treating liquid flows into the outer recollecting container 426. According to an embodiment, each inlet 422a and 426a may be positioned at different heights. The recollecting lines 422b and 426b are connected below bottom surfaces of each of the recollecting containers 422 and 426. A treating liquid taken into each of the recollecting containers 422 and 426 can be reused and provided to an outer treating liquid regeneration system (not shown) through the recollecting lines 422b and 426b.

The support unit 440 supports the substrate W in the treating space 412. The support unit 440 supports and rotates the substrate W during the process. The support unit 440 includes a support plate 442, a support pin 444, a chuck pin 446, and rotation driving members 448 and 449.

The support plate 442 is provided in a substantially circular plate shape and has a top surface and a bottom surface. The bottom surface has a smaller diameter than the top surface. That is, the support plate 442 may have a shape of a top wide-bottom narrow structure with a wide top surface and a narrow bottom surface. The top surface and the bottom surface are positioned so that their central axes coincide with each other. In addition, a heating means (not shown) may be provided at the support plate 442. The heating means provided to the support plate 442 may heat the substrate W placed on the support plate 442. The heating means may generate a heat. The heat generated by the heating means may be warm or cold. The heat generated by the heating means may be transferred to the substrate W placed on the support plate 442. In addition, the heat transferred to the substrate W may heat the treating liquid supplied to the substrate W. The heating means may be a heater and/or a cooling coil. However, the inventive concept is not limited thereto, and the heating means may be variously modified by known devices.

A plurality of support pins 444 are provided. The support pin 444 is disposed to be spaced apart at a predetermined space at an edge portion of a top surface of the support plate 442 and upwardly protrudes from the support plate 442. The support pins 444 are arranged to have an annular ring shape as a whole by combination with each other. The support pin 444 supports an edge region of a bottom surface of the substrate W so that the substrate W is spaced apart from the top surface of the support plate 442 by a predetermined distance.

A plurality of chuck pins 446 are provided. The chuck pin 446 is disposed farther from a center of the support plate 442 than the support pin 444. The chuck pin 446 is provided to upwardly protrude from the top surface of the support plate 442. The chuck pin 446 supports a side portion of the substrate W so that the substrate W is not separated from a correct position in a lateral direction when the support plate 442 is rotated. The chuck pin 446 is provided to be linearly moved between an outer position and an inner position along a radial direction of the support plate 442. The outer position is a position farther from the center of the support plate 442 than the inner position. If the substrate W is loaded or unloaded on the support plate 442, the chuck pin 446 is positioned at the outer position, and of a process is performed on the substrate W, the chuck pin 446 is positioned at the inner position. The inner position is a position at which the chuck pin 446 and the side portion of the substrate W contact each other, and the outer position is a position at which the chuck pin 446 and the substrate W are spaced apart from each other.

The rotation driving members 448 and 449 rotate the support plate 442. The support plate 442 may be rotated around its center axis by rotation driving members 448 and 449. The rotation driving members 448 and 449 include a support shaft 448 and a driving unit 449. The support shaft 448 has a cylindrical shape facing the fourth direction 16. A top end of the support shaft 448 is fixedly coupled to the bottom surface of the support plate 442. According to an embodiment, the support shaft 448 may be fixedly coupled to a center of the bottom surface of the support plate 442. The driving unit 449 provides a driving force such that the support shaft 448 is rotated. The support shaft 448 may be rotated by the driving unit 449, and the support plate 442 may be rotated together with the support shaft 448.

The lifting/lowering unit 460 linearly moves the treating container 420 in the up/down direction. As the treating container 420 is moved up and down, a relative height of the treating container 420 with respect to the support plate 442 is changed. If the substrate W is loaded on or unloaded on the support plate 442, the treating container 420 is lowered so that the support plate 442 protrudes above the treating container 420. In addition, if the process is performed, a height of the treating container 420 is adjusted so that the treating liquid may flow into predetermined recollecting containers 422 and 426 according to a type of treating liquid supplied to the substrate W. The lifting/lowering unit 460 has a bracket 462, a moving shaft 464, and a driver 466. The bracket 462 is fixedly installed on an outer wall of the treating container 420, and the moving shaft 464 which is moved in the up/down direction by the driver 466 is fixedly coupled to the bracket 462. Selectively, the lifting/lowering unit 460 may move the support plate 442 in the up/down direction.

The liquid supply unit 480 may supply a first treating liquid to the substrate W. The first treating liquid may be a chemical. In an embodiment, the first treating liquid may be provided as a treating liquid which can etch an oxide film on the substrate. In an embodiment, a dilute hydrofluoric acid (DHF) may be used.

The liquid supply unit 480 may include a moving member 481 and a nozzle 489. The moving member 481 moves the nozzle 489 to a process position and a standby position. The process position is a position at which the nozzle 489 faces the substrate W supported by the support unit 440. According to an embodiment, the process position is a position at which the treating liquid is discharged to the top surface of the substrate W. The process position also includes a first supply position and a second supply position. The first supply position may be a position closer to the center of the substrate W than the second supply position, and the second supply position may be a position including an end of the substrate. Selectively, the second supply position may be a region adjacent to the end of the substrate. The standby position is defined as a position at which the nozzle 489 deviates from the process position. According to an embodiment, the standby position may be a position at which the nozzle 489 stands-by before or after a process treatment is completed on the substrate W.

The moving member 481 includes an arm 482, a support shaft 483, and a driver 484. The support shaft 483 is positioned at a side of the treating container 420. The support shaft 483 has a rod shape with its lengthwise direction in the third direction Z. The support shaft 483 may be provided to be rotatable by the driver 484. The support shaft 483 is provided to be able to move up and down. The arm 482 is coupled to the top end of the support shaft 483. The arm 482 extends vertically from the support shaft 484. A nozzle 489 is coupled to an end of the arm 482. As the support shaft 483 is rotated, the nozzle 489 may swing together with the arm 482. The nozzle 489 may be swing-moved to the process position and the standby position. Selectively, the arm 482 may be provided to be capable of being forwardly and backwardly moved in its lengthwise direction. When viewed from above, a path through which the nozzle 489 moves may coincide with a central axis of the substrate W at the process position.

The organic solvent treating unit 140 may be provided with a substrate treating apparatus in which a liquid treatment is performed in a single-type method. The substrate treating apparatus provided to the organic solvent treating unit 140 may have the same structure as the substrate treating apparatus 400 provided to the liquid treating unit 130 shown in FIG. 1. Thus, the same drawing number is assigned to the same structure, and a redundant description is omitted.

A plurality of organic solvent treating units 140 may be provided. A plurality of organic solvent treating units 140 may be provided and stacked in the vertical direction. The organic solvent treating unit 140 may rotate the substrate W in a horizontal posture, but may supply the treating liquid to the rotating substrate W to treat the substrate W. The organic solvent treating unit 140 may treat the substrate W one by one. The treating liquid supplied from the organic solvent treating unit 140 can be replaced with the rinsing liquid described later and provided as a liquid capable of removing the rinsing liquid remaining on the surface of the substrate W. For example, the treating liquid supplied from the organic solvent treating unit 140 may be an organic solvent. For example, the treating liquid supplied from the organic solvent treating unit 140 may be isopropyl alcohol (IPA). The organic solvent treating unit 140 may supply the organic solvent to the rotating substrate W, and may dry the substrate W by rotating the substrate W. In contrast, the organic solvent treating unit 140 supplies the organic solvent to the rotating substrate W, and is transferred to the dry treating unit 150 described later while the substrate W is wet with the organic solvent, so that the substrate W may be dried in the dry treating unit 150.

Figure 3:
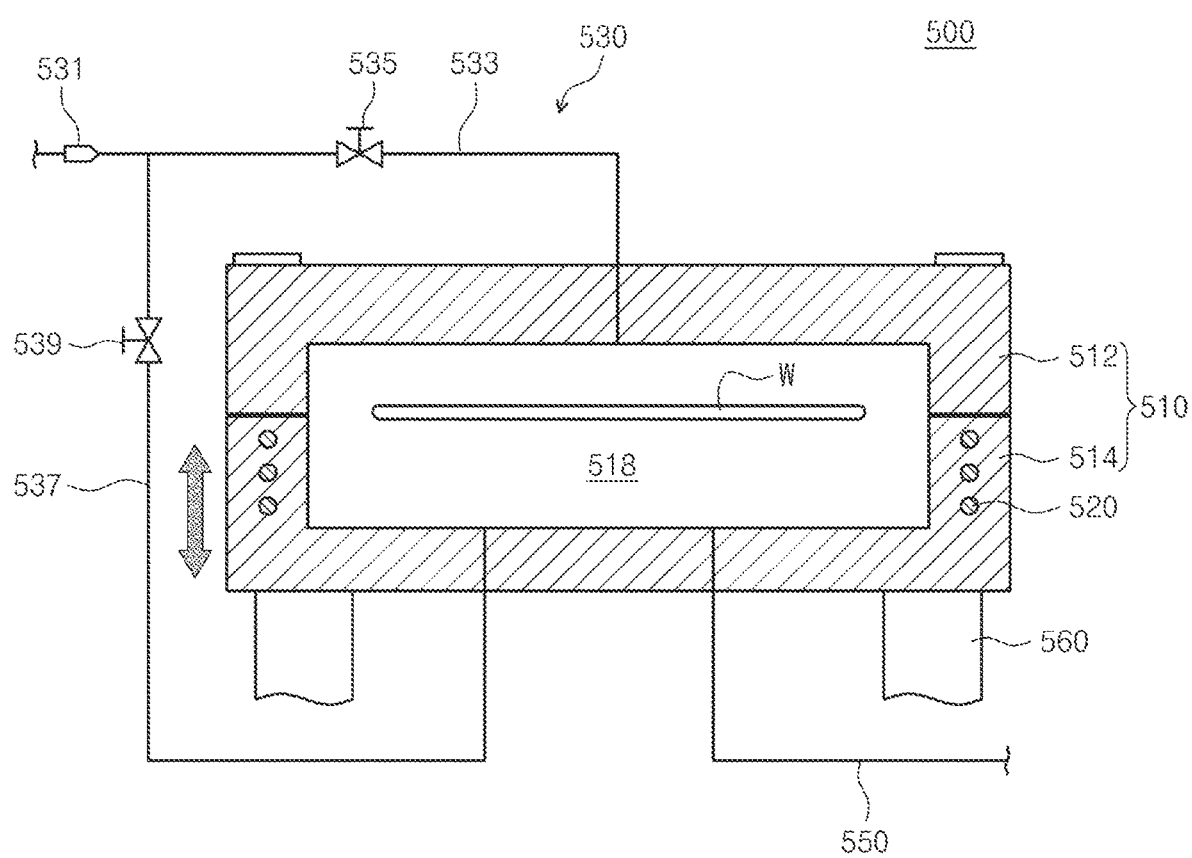
FIG. 3 illustrates a substrate treating apparatus provided to a single-type drying chamber of FIG. 1.

FIG. 3 illustrates the substrate treating apparatus provided in the single-type drying chamber of FIG. 1.

Referring to FIG. 3, the substrate treating apparatus 500 at which a single-type substrate dry treatment is performed may be provided to the dry treating unit 150. At the dry treating unit 150, the treating liquid remaining on the substrate W may be removed by using a drying fluid G in a supercritical state. The dry treating unit 500 can be a supercritical chamber which removes the treating liquid (e.g., a rinsing liquid or an organic solvent) remaining on the substrate W using the supercritical fluid. For example, the substrate treating apparatus 500 provided in the dry treating unit 150 may perform a drying process of removing the organic solvent remaining on the substrate W using a carbon dioxide ($CO_2$) in the supercritical state.

The substrate treating apparatus 500 provided in the dry treating unit 150 may include a body 510, a heating member 520, a fluid supply unit 530, a fluid exhaust unit 550, and a lifting/lowering member 560. The body 510 may have an inner space 518 in which the substrate W is treated. The body 510 may provide an inner space 518 in which the substrate W is treated. The body 510 may provide an inner space 518 at which the substrate W is dried by the drying fluid in the supercritical state.

The body 510 may include a top body 512 and a bottom body 514. The top body 512 and the bottom body 514 may be combined with each other to form the inner space 518. The substrate W may be supported in the inner space 518. For example, the substrate W may be supported by a support member (not shown) in the inner space 518. The support member may be configured to support a bottom surface of the edge region of the substrate W. Any one of the top body 512 or the bottom body 514 may be coupled to the lifting/lowering member 560 to be moved in the up/down direction. For example, the bottom body 514 may be coupled to the lifting/lowering member 560 and may be moved in the up/down direction by the lifting/lowering member 560. Accordingly, the inner space 518 of the body 510 may be selectively sealed. Although the above-described example has been described as an example in which the bottom body 514 is coupled to the lifting/lowering member 560 and moves in the up/down direction, the inventive concept is not limited to it. For example, the top body 512 may be coupled to the lifting/lowering member 560 to move in the up/down direction.

The heating member 520 may heat the drying fluid supplied to the inner space 518. The heating member 520 may increase a temperature of the inner space 518 of the body 510 to phase-change the drying fluid supplied to the inner space 518 into the supercritical state. In addition, the heating member 520 may increase the temperature of the inner space 518 of the body 510 so that the drying fluid in a supercritical state supplied to the inner space 518 maintains the supercritical state.

In addition, the heating member 520 may be embedded in the body 510. For example, the heating member 520 may be embedded in any one of the top body 512 or the bottom body 514. For example, the heating member 520 may be provided in the bottom body 514. However, the inventive concept is not limited thereto, and the heating member 520 may be provided at various positions capable of increasing the temperature of the inner space 518. In addition, the heating member 520 may be a heater. However, the inventive concept is not limited thereto, and the heating member 520 can be variously modified as a known device capable of increasing the temperature of the inner space 518.

The fluid supply unit 530 may supply the drying fluid to the inner space 518 of the body 510. The drying fluid supplied by the fluid supply unit 530 may include a carbon dioxide $CO_2$. The fluid supply unit 530 may include a fluid supply source 531, a first supply line 533, a first supply valve 535, a second supply line 537, and a second supply valve 539.

The fluid supply source 531 may store and/or supply the drying fluid supplied to the inner space 518 of the body 510. The fluid supply source 531 may supply the drying fluid to the first supply line 533 and/or the second supply line 537. For example, the first supply valve 535 may be installed on the first supply line 533. In addition, the second supply valve 539 may be installed on the second supply line 537. The first supply valve 535 and the second supply valve 539 may be on/off valves. According to on/off of the first supply valve 535 and the second supply valve 539, the drying fluid may selectively flow through the first supply line 533 or the second supply line 537.

In the above-described example, the first supply line 533 and the second supply line 537 are connected to one fluid supply source 531, but are not limited thereto. For example, a plurality of fluid supply sources 531 may be provided, the first supply line 533 may be connected to one of the plurality of fluid supply sources 531, and the second supply line 537 may be connected to another other of the fluid supply sources 531.

Also, the first supply line 533 may be a top supply line which supplies a drying gas from above of the inner space 518 of the body 510. For example, the first supply line 533 may supply the drying gas to the inner space 518 of the body 510 in a direction from a top to a bottom. For example, the first supply line 533 may be connected to the top body 512. Also, the second supply line 537 may be a bottom supply line which supplies the drying gas from below the inner space 518 of the body 510. For example, the second supply line 537 may supply the drying gas to the inner space 518 of the body 510 in a direction from the bottom to the top. For example, the second supply line 537 may be connected to the bottom body 514.

The fluid exhaust unit 550 may exhaust the drying fluid G from the inner space 518 of the body 510.

The buffer unit 160 may provide a storage space for temporarily storing the substrate W. The buffer unit 160 may temporarily store the substrate W treated by the liquid treating unit 130, the organic solvent treating unit 140, and the dry treating unit 150. In addition, the buffer unit 160 may store the substrate W treated by the batch-type second process treating unit 30 to be described later. The buffer unit 160 may include a plurality of buffer units 160, and each of the plurality of buffer units 160 may store a substrate W treated by the liquid treating unit 130, a substrate W treated by the organic solvent treating unit 140, a substrate W treated by the dry treating unit 150, and a substrate W treated by the second process treating unit 30.

The buffer unit 160 may be disposed on a side of the transfer treating unit 170 to be described later. When viewed from above, the buffer unit 160 may be open toward the posture changing unit 20 to be described later. When viewed from above, the buffer unit 160 may be open toward the transfer treating unit 170 to be described later. Accordingly, the posture changing robot 220 may change the posture of the substrate W in the posture changing treating bath 210 and transfer the substrate W having a changed posture to the buffer unit 160. In addition, the substrate W transferred to the first buffer unit 210 may be taken out by the first transfer robot 172 of the transfer treating unit 170. The taken out substrate W may be transferred to the single-type organic solvent treating unit 140 and/or the single-type dry treating unit 150.

Figure 4:
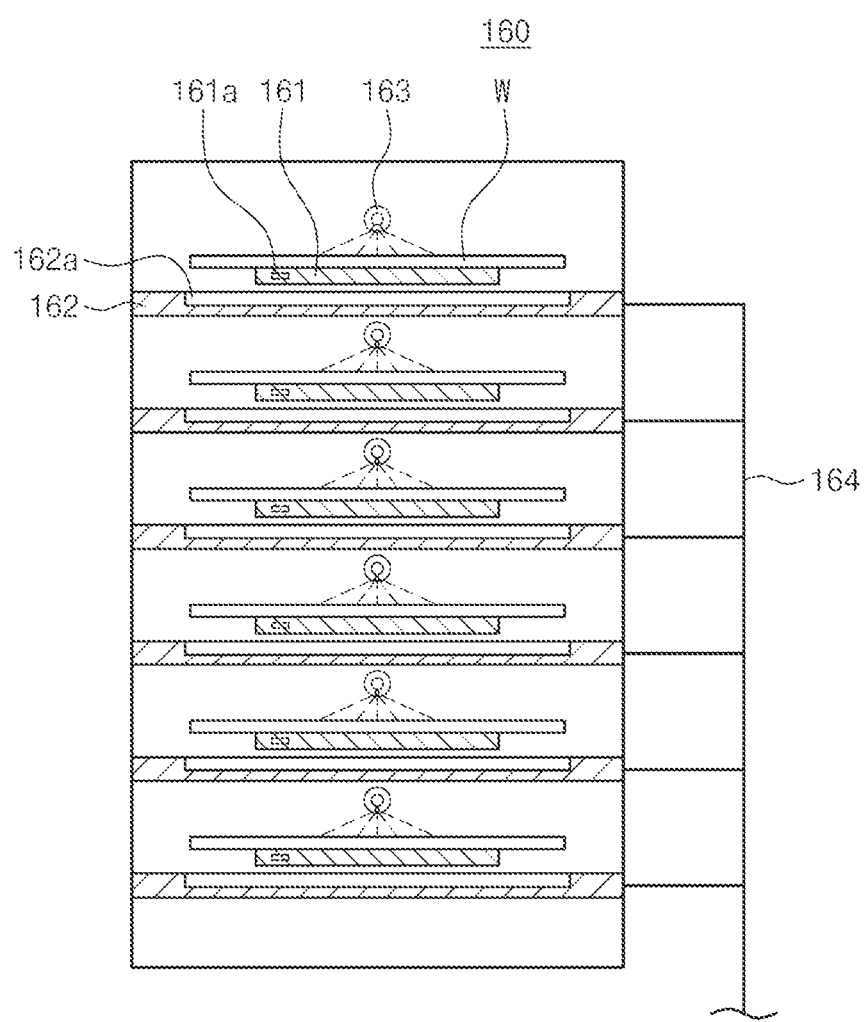
FIG. 4 illustrates a state of a buffer unit of FIG. 1.

FIG. 4 illustrates a state of the buffer unit of FIG. 1.

Referring to FIG. 4, the buffer unit 160 may have a structure of supplying a wetting liquid to the storage space so as to prevent the substrate W taken into the storage space from being dried (to maintain a wettability of the substrate W). In addition, the substrates W stored in the buffer unit 160 may be stored in respective storage spaces partitioned in the buffer unit 160.

The buffer unit 160 may include a support shelf 161, a drain partition 162, a wetting nozzle 163, and a drain line 164.

The support shelf 161, the drain partition 162, and the wetting nozzle 163 may be provided in a plurality to correspond to each substrate W taken into the buffer unit 160. The support shelf 161 may support the substrate W in a space provided by the buffer unit 160. In addition, a weight sensor 161a may be installed on the support shelf 161. The weight sensor senses the weight of the substrate W supported by the support shelf 161, thereby confirming the amount of the wetting liquid W supplied on the substrate W.

The controller 900 may adjust the amount of wetting liquid WL per unit time sprayed from the wetting nozzle 163 based on the weight of the substrate W supported by the support shelf 161. The support shelf 161 may be provided to support the bottom surfaces of a side and the other side of the substrate W.

The wetting nozzle 163 may be configured to spray the wetting liquid in a stream manner or spray manner. A plurality of wetting nozzles 163 may be provided. A pair of wetting nozzles 163 may spray the wetting liquid onto the substrate W to each substrate W. The wetting nozzle 163 may include a chemical capable of maintaining the wettability of the substrate W taken back to the storage space of the buffer unit 160 or a nozzle for supplying a mist. The chemical or the mist may supply a wetting liquid selected among an isopropyl alcohol (IPA), the above-described chemical, and the above-described rinsing liquid.

The drain partition wall 162 may be disposed below the support shelf 161. The drain partition wall 162 may be disposed below each of the substrates W supported on the support shelf 161. The drain partition wall 162 may serve as a liquid receiver to receive the wetting liquid sprayed by the wetting nozzle 163, and may partition the spaces in which the respective substrates W are disposed. The drain partition wall 162 has a square cylindrical shape with an open top so as to have a liquid receiving space, and the liquid receiving space of the drain partition wall 162 may be connected to the drain line 164. Accordingly, the wetting liquid sprayed by the wetting nozzle 163 may be discharged to the outside.

The transfer treating unit 170 may be disposed between the buffer unit 160 and the substrate treating unit for treating the substrate W in a single-type method. A liquid treating unit 130 and a buffer unit 160 may be disposed on a side of the transfer treating unit 170, and an organic solvent treating unit 140 and a dry treating unit 150 may be disposed on the other side of the transfer treating unit 170.

The transfer treating unit 170 may have a first transfer robot 172. The first transfer robot 172 may have a single-type transfer hand for transferring one substrate W by one by one. The first transfer robot 172 may transfer the substrate W between the liquid treating unit 130 and the buffer unit 160. The first transfer robot 172 may take out the substrate W from the liquid treating unit 130 and transfer the substrate W to the buffer unit 160. In this case, the posture changing robot 220 to be described later may transfer the substrate W taken into the buffer unit 160 to the second process treating unit 30. The first transfer robot 172 may transfer the substrate W between the buffer unit 160, the organic solvent treating unit 140, and the dry treating unit 4. The first transfer robot 172 may transfer the substrate W taken into the buffer unit 160 to the organic solvent treating unit 140. The first transfer robot 172 may transfer the substrate W treated by the organic solvent treating unit 140 to the dry treating unit 150. The first transfer robot 172 transfers the substrate W treated by the dry treating unit 150 to the buffer unit 160, and the index robot 122 can take the substrate W from the buffer unit 160 and bring the substrate W into the container F placed in the load port. That is, the transfer treating unit 170 may transfer the substrate W between the buffer unit 160 and the substrate treating unit which treats the substrate W in a single-type method.

Referring back to FIG. 1, the posture changing unit 20 may change the posture of the substrate W. The posture change unit 20 may be disposed between the first process treating unit 10 which treats the substrate W in a single-type method and the second process treating unit 30 which treats the substrate in a batch-type method. The posture change unit 20 may be disposed between the first process treating unit 10 which treats the substrate W in a horizontal posture and the second process treating unit 30 which treats the substrate W in a vertical posture. The posture changing unit 20 may change the posture of the substrate W between the vertical posture and the horizontal posture. The posture changing unit 20 may change the substrate W having the vertical posture to the horizontal posture. The posture changing unit 20 may change the substrate W having a horizontal posture to a vertical posture. The posture changing unit 20 may change the substrate W treated in the horizontal posture in the liquid treating unit 130 of the first process treating unit 10 or the substrate W stored in the horizontal posture in the buffer unit 150 of the first process treating unit 10 to the vertical posture. The posture change unit 20 may change the posture of the substrate W so that the substrate W treated in a vertical posture in the second process treating unit 30 may be post-treated in the organic solvent treating unit 140 and the dry treating unit 150 of the first process treating unit 10 with respect to one substrate W in a horizontal position.

Figure 5:
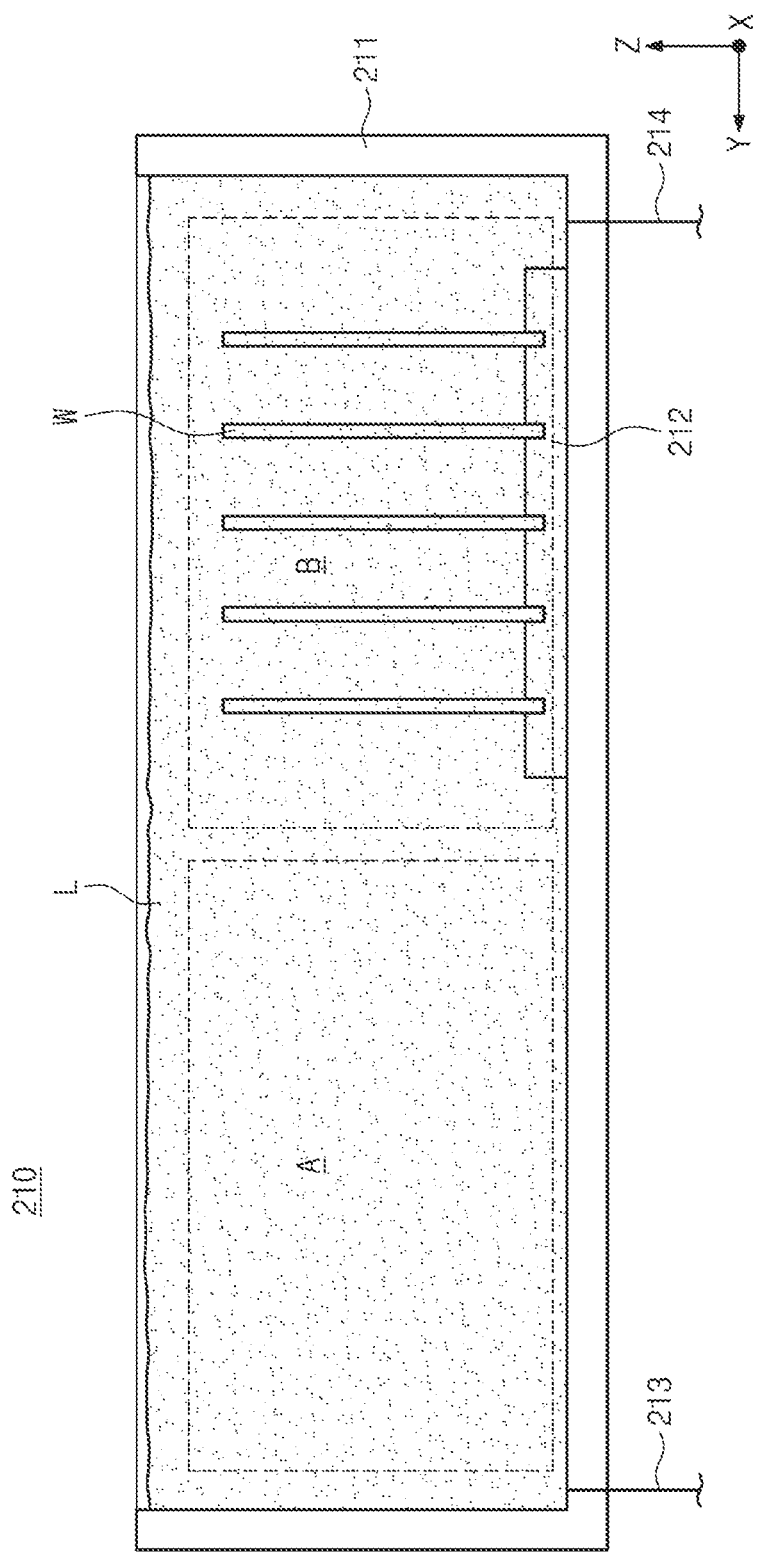
FIG. 5 illustrates a state of a posture changing treating bath of FIG. 1.

FIG. 5 illustrates a state of the posture changing treating bath of FIG. 1.

Referring to FIG. 5, the posture changing treating bath 151 may include a treating bath 152, a support member 153, a supply line 154, and a recollecting line 155.

The treating bath 211 may have a cylindrical shape with an open top. The treating bath 211 may have a rectangular cylindrical shape with an open top. The treating bath 211 may have accommodation spaces A and B in which the treating liquid L may be stored. The treating liquid L stored in the treating bath 211 may be a liquid containing water. The type of the treating liquid L stored in the treating bath 211 may be the same type of wetting liquid sprayed from the buffer unit 160. For example, both the treating liquid L stored in the treating bath 211 and the wetting liquid sprayed from the buffer unit 160 may be a liquid containing water.

The support member 212 may be disposed in the accommodation spaces A and B to support the substrate W. The support member 212 may be configured to support a plurality of substrates W. For example, the support member 212 may be configured to support 50 substrates W. The support member 212 may be arranged so that a pair of rod-shaped bodies face each other, and a support groove (not shown) through which the substrate W can be supported is formed in each body.

The supply line 213 may supply the treating liquid L to the accommodation spaces A and B. The recollecting line 214 may drain the treating liquid L in the accommodation spaces A and B. A valve is installed in each of the supply line 213 and the recollecting line 214 and the amount of the treating liquid L stored in the accommodation spaces (i.e., the accommodation spaces (A, B)) can be adjusted to a set level based on the level of the treating liquid L sensed by the liquid level sensor which is not shown.

In addition, the accommodation spaces A and B may include a support region A and a posture changing region B. The support region A may be a region in which the support member 212 supports the substrate W. The posture changing region B may be a region in which the posture of the substrate W is changed by the posture changing robot 220 to be described later.

Referring back to FIG. 1, the posture changing robot 220 may be disposed on a side of the posture changing treating bath 210. The posture changing robot 220 may be disposed between the posture changing treating bath 210 and the transfer treating unit 170. The posture changing robot 220 may be disposed between the posture changing treating bath 210 and the buffer unit 160. The posture changing robot 220 may transfer the substrate W between the buffer unit 160 and the posture changing treating bath 210. The posture changing robot 220 may include a hand 230 and a joint unit 240. The hand 230 may be coupled to the joint unit 240. The joint unit 240 may change the position of the hand 230.

Figure 6:
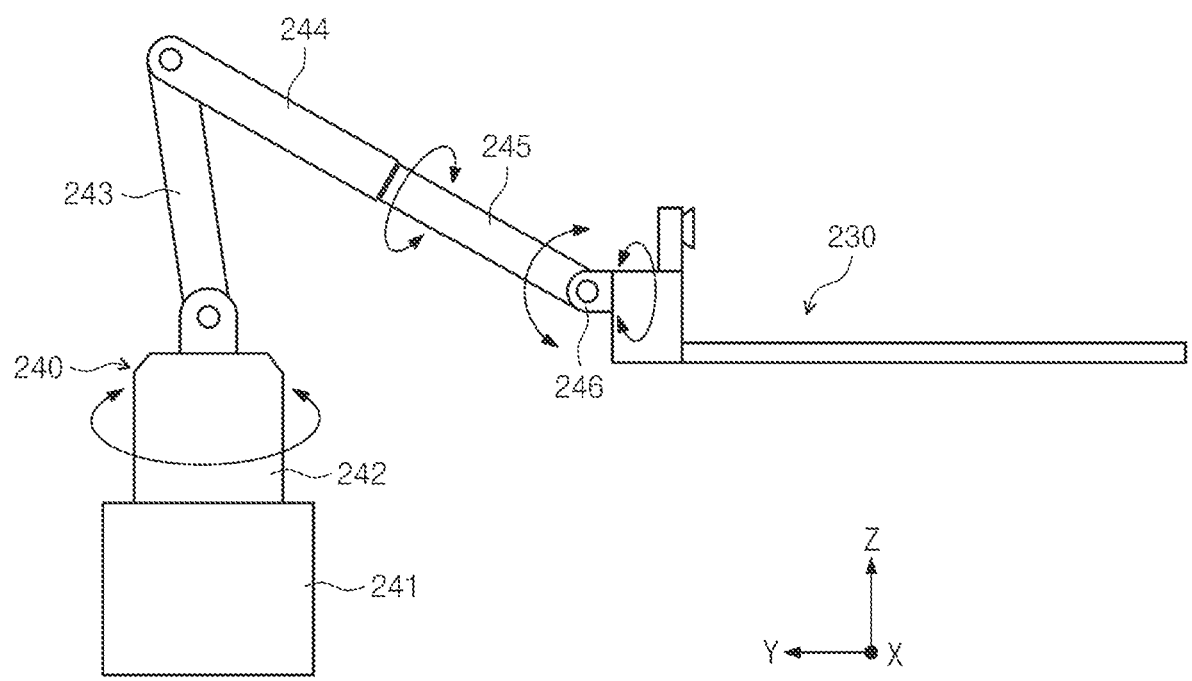
FIG. 6 schematically illustrates a posture changing robot of FIG. 1.

FIG. 6 schematically illustrates the posture changing robot of FIG. 1. Referring to FIG. 6, the posture changing robot 220 may change the posture of the substrate W between the vertical posture and the horizontal posture in the posture changing treating bath 210. The posture changing robot 220 may transfer the substrate W stored in the buffer unit 160 to the posture changing treating bath 210 and change the substrate W in the horizontal posture to the vertical posture in the posture changing treating bath 210. In addition, the posture changing robot 220 may change the posture of the substrate W from the vertical posture to the horizontal posture in the posture changing treating bath 210 and transfer the substrate W to the buffer unit 160 of the first process treating unit 10. The posture changing robot 220 may be a multi-joint robot. The posture changing robot 220 may be a six-axis multi-joint robot.

The joint portion 240 may be a multi-joint arm composed of at least two or more axes. For example, the joint portion 240 may be a 6-axis multi-joint arm. The joint unit 240 may change the position of the hand 230 by moving the hand 230 in at least one of the first direction X, the second direction Y, and the third direction Z. In addition, the joint unit 240 may rotate the hand 230 based on one of the axes of the first direction X, the second direction Y, and the third direction Z.

The posture changing robot 220 may include a base 241, a rotating body 242, a first arm 243, a second arm 244, a third arm 245, and a fourth arm 246.

The base 241 may be coupled to the rotating body 242. The rotating body 242 may rotate with respect to the base 241. The rotation body 242 may be rotated with a direction perpendicular to the ground as a rotation axis. The first arm 243 may be coupled to the rotating body 242. The first arm 243 may be rotated with respect to the rotation body with the horizontal direction as a rotation axis. The second arm 244 may be coupled to the first arm 243. The second arm 244 may be rotated with respect to the first arm 243 with the horizontal direction as a rotation axis. The third arm 245 may be coupled to the second arm 244. The third arm 245 may be rotated around a lengthwise direction (or a lengthwise direction of the third arm 245) of the second arm 244 as a rotation axis. The fourth arm 246 may be rotated with a direction perpendicular to the lengthwise direction of the third arm 245 as a rotation axis. In addition, the fourth arm 246 may rotate the hand 230. For example, the fourth arm 246 may have a rotation shaft (not shown) capable of rotating the hand 230. The hand 230 may be rotated with a direction perpendicular to the rotation axis of the fourth arm 246 as a rotation axis.

Figure 7:
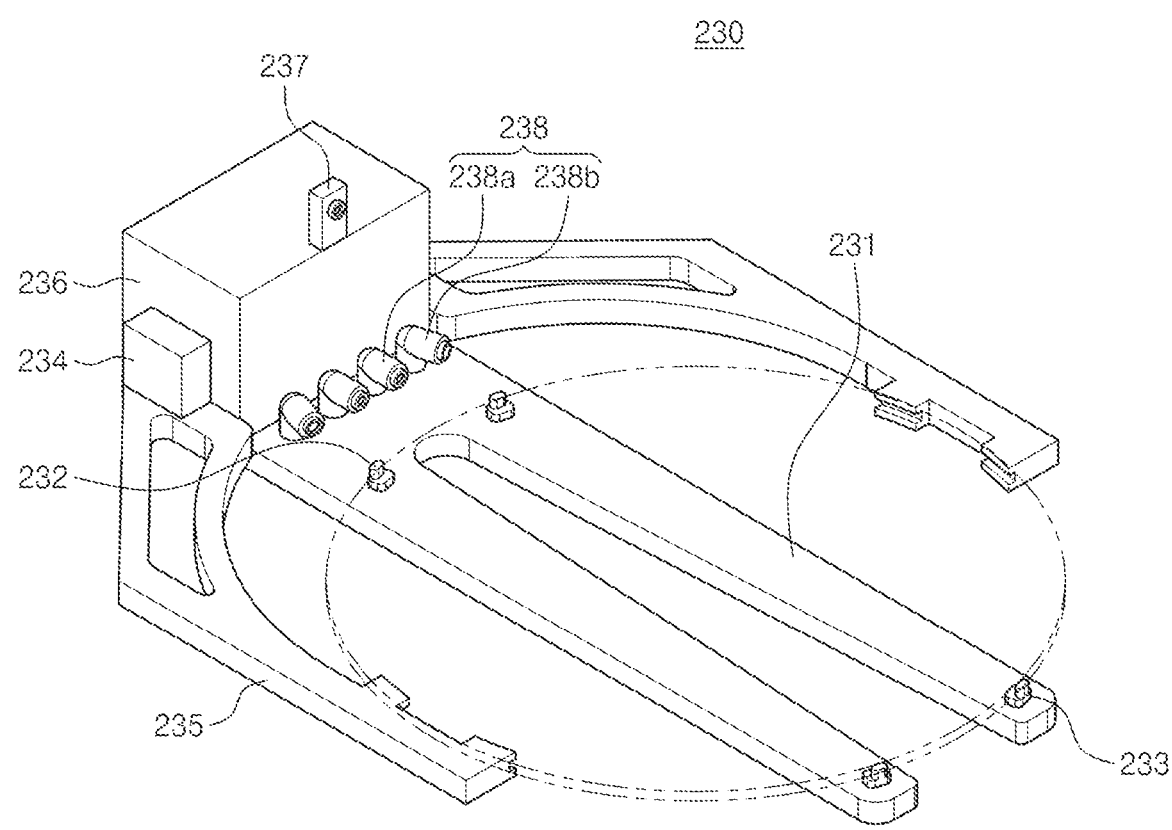
FIG. 7 illustrates a hand of FIG. 6.

FIG. 7 illustrates the hand of FIG. 6. Referring to FIG. 7, the hand 230 of the posture changing robot 220 may include a support body 231, a first guide unit 232, a second guide unit 233, a driving member 234, a chucking body 235, a fastening body 236, a vision member 237, and a liquid supply member 238.

The support body 231 may support a bottom surface of the substrate W. The support body 231 may support a top surface on which a pattern of the substrate W is formed, a bottom surface on which a pattern is not formed, and a bottom surface of the substrate W. That is, the substrate W may be placed on the support body 231.

A first guide portion 232 and a second guide portion 233 may be provided in the support body 231. The first guide portion 232 may be a support pad close to the fastening body 236 to be described later. The second guide portion 233 may be a support pad far from the fastening body 236 to be described later. Each of the first guide portion 232 and the second guide portion 233 may be provided in a pair. The first guide portion 232 and the second guide portion 233 may support a bottom surface and/or a side surface of the substrate W. The first guide portion 232 and the second guide portion 233 may have a stepped shape on top surfaces thereof. For example, a height of an inner region supporting the bottom surface of the substrate W among the top surfaces of the first guide part 232 may be lower than a height of an outer region supporting the bottom surface of the substrate W. Similarly, the height of the inner region supporting the bottom surface of the substrate W among the top surfaces of the second guide unit 233 may be lower than the height of the outer region supporting the bottom surface of the substrate W. That is, the substrate W may be placed on the support body 231 via a first guide portion 232 and a second guide portion 233 installed on the support body 231. The substrate W placed on the support body 231 should be interpreted to include not only the case where the support body 231 and the substrate W come into direct contact, but also the substrate W placed on the first guide part 232 and the second guide part 233 installed on the support body 231.

The driving member 234 may be fastened to the fastening body 236. The driving member 234 may be a driver capable of moving the chucking body 235 in a lateral direction. A pair of driving members 234 may be provided. For example, the driving member 234 may be provided to correspond to each of the chucking bodies 235 provided in a pair. The pair of driving members 234 may move the pair of chucking bodies 235 in the lateral direction. The chucking bodies 235 may be moved in a direction close to the side of the substrate W and in a direction away from the side of the substrate W. Accordingly, the chucking body 235 may chuck the substrate W placed on the support body 231. In other words, the support body 231 and the chucking body 235 may be bodies holding the substrate W.

The fastening body 236 may be a body for coupling the chucking body 235 and the support body 231 to the joint portion 220-R. The fastening body 236 may be a body that couples the chucking body 235 and the support body 231 to the fourth arm 246 of the joint 220-R. The fastening body 236 may be fastened to a rotation shaft of the fourth arm 246 of the joint 220-R.

A first guide portion 232 and a second guide portion 233 may be provided to each of the support bodies 231. The first guide portion 232 may be a protrusion close to the fastening body 236 to be described later. The second guide portion 233 may be a protrusion relatively far from the fastening body 236 to be described later. The second guide portion 233 may be disposed farther from the fastening body 236 than the first guide portion 232. The first guide portion 232 and the second guide portion 233 may support the side portion of the substrate W. The first guide part 232 and the second guide part 233 support the side of the substrate W, and the distance between the two may be slightly smaller than the diameter of the substrate W.

The vision member 247 may acquire an image by photographing the substrate W and/or the support body 231. The acquired image may be transmitted to the controller 900 to be described later. The controller 900 may generate a control signal for controlling the driving of the posture changing robot 220 based on the image acquired by the vision member 237.

The liquid supply member 238 may supply the wetting liquid WL to the substrate W placed on the support body 231. The wetting liquid WL may include water. The wetting liquid WL supplied by the liquid supply member 238 may be the same kind of liquid as the treating liquid L that stores in the accommodation spaces A and B. In addition, the wetting liquid WL supplied by the liquid supply member 238 may be the same type of the wetting liquid WL supplied by the buffer unit 160 to be described later.

The liquid supply member 238 may include a first nozzle 238a and a second nozzle 238b. At least one of the first nozzles 238a and the second nozzles 238b may be provided. A plurality of first nozzles 238a and a plurality of second nozzles 238b may be provided. The first nozzle 238a may supply the wetting liquid WL to the first region of the substrate W placed on the support body 231. The second nozzle 238b may supply the wetting liquid WL to the second region of the substrate W placed on the support body 231.

The first region and the second region may be different regions. The first region and the second region may be edge regions of the substrate W as described below. The first region may be adjacent to the first nozzle 238a, and the second region may be adjacent to the second nozzle 238b.

A distance between the first region and the first nozzle 238a may be shorter than a distance between the second region and the second nozzle 238b. That is, the injection distance of the wetting liquid WL supplied from the first nozzle 238a may be different from the injection distance of the wetting liquid WL supplied from the second nozzle 238b. For example, the injection distance of the wetting liquid WL supplied from the first nozzle 238a may be shorter than the injection distance of the wetting liquid WL supplied from the second nozzle 238b.

Also, when viewed from above, the first nozzles 238a may be disposed between the second nozzles 238b. The second nozzles 238b may be disposed at a position relatively close to the chucking body 235, that is, an outside. The first nozzles 238a may be disposed at a position relatively far from the chucking body 235, that is, an inside.

The spraying directions of the wetting liquid WL of the first nozzle 238a and the second nozzle 238b may be different from each other. For example, based on a virtual reference line passing through a center of the substrate W and a center of the vision member 237 when seen from above, the first nozzle 238a may supply the wetting liquid WL in a direction parallel to the reference line, and the second nozzle 238b may supply the wetting liquid WL in a direction inclined to the reference line.

A diameter of the injection holes of the first nozzle 238a and the second nozzle 238b may be different from each other. For example, the diameter of the injection hole of the first nozzle 238a may be greater than the diameter of the injection hole of the second nozzle 238a. For example, a supply flow rate of the wetting liquid WL transmitted to the first nozzle 238a and the second nozzle 238b may be the same per unit time. Accordingly, the injection distance of the wetting liquid WL injected from the first nozzle 238a may be shorter than the injection distance of the wetting liquid WL injected from the second nozzle 238b.

In addition, the first nozzle 238a and the second nozzle 238b may be installed on the support body 231.

Referring back to FIG. 1, the second process treating unit 30 may treat the substrate W treated by the first process treating unit 10. The second process treating unit 30 may treat the liquid-treated substrate W in the first process treating unit 10. The second process treating unit 30 may collectively liquid treat a plurality of substrates W in a batch-type method. For example, the second process treating unit 30 may clean a plurality of substrates W in a batch-type method. The second process treating unit 30 may simultaneously treat the plurality of substrates W in a vertical posture (a posture at which a top or bottom surface of the substrate W is parallel to a direction perpendicular to the ground).

The second process treating unit 30 may include a first batch-type treating bath 310, a second batch-type treating bath 320, and a transfer unit 330.

In the first batch-type treating bath 310, a plurality of substrates W may be simultaneously liquid-treated with a second treating liquid. The second treating liquid may be a chemical. The second treating liquid may be a chemical having the properties of a strong acid or a strong base. The chemical may include, for example, an ammonia-hydrogen peroxide mixture (APM), a hydrochloric acid-hydrogen peroxide mixture (HPM), a hydrofluoric acid-hydrogen peroxide mixture (FPM), a diluted sulfuric acid peroxide (DSP), a chemical including a SiN, a chemical including a phosphoric acid, and a chemical including a sulfuric acid.

In the second batch-type treating bath 320, the plurality of substrates W may be simultaneously liquid-treated with a third treating liquid. The second treating liquid may be a rinsing liquid. The rinsing liquid may be a liquid containing water. For example, the rinsing liquid may be appropriately selected from a pure water or an ozone water.

Since the first batch-type treating bath 310 and the second batch-type treating bath 320 have the same or similar structures except for the type of treating liquid used, only the first batch-type treating bath 310 will be described below, and repeated descriptions of the second batch-type treating bath 320 will be omitted.

Figure 8:
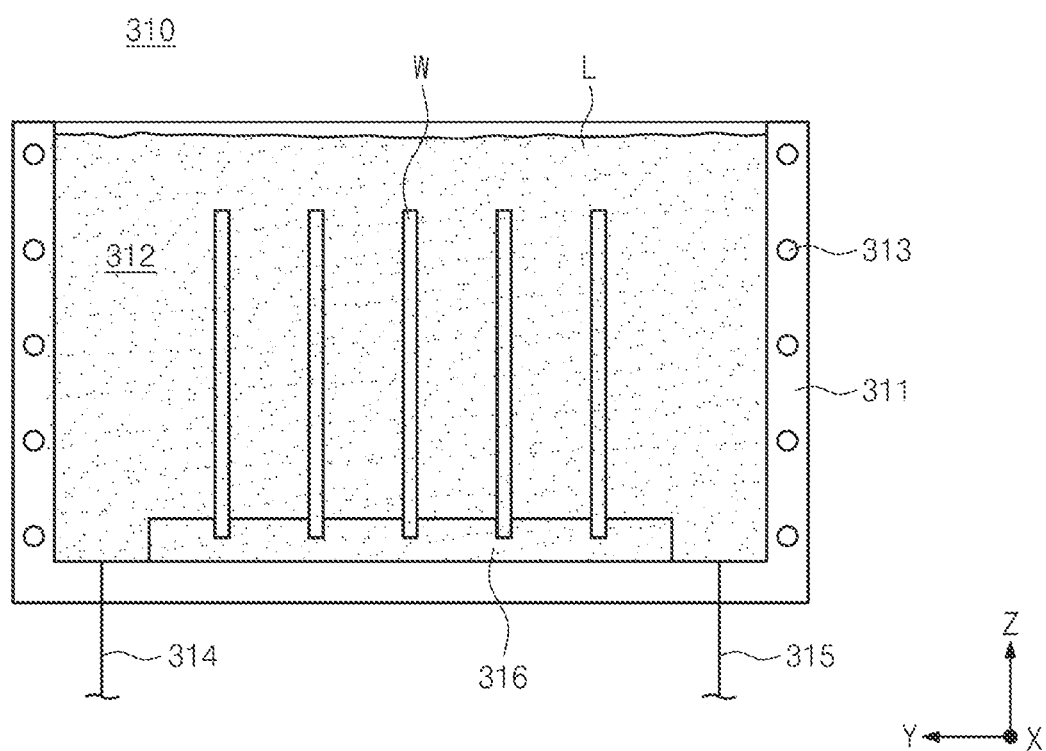
FIG. 8 illustrates any one batch-type treating bath among batch-type treating baths of FIG. 1.

FIG. 8 illustrates a state of a batch-type treating bath of any one of the batch-type treating baths of FIG. 1. For example, FIG. 8 illustrates the first batch-type treating bath 310.

Referring to FIG. 8, the first batch-type treating bath 310 may include a treating bath 311, a heating member 313, a supply line 314, a recollecting line 315, and a support member 316.

The treating bath 311 may have an accommodation space 312 therein. The treating bath 311 may have a cylindrical shape with an open top. The treating liquid L may be stored in the accommodation space 312 of the treating bath 311. In order to adjust a temperature of the treating liquid L stored in the accommodation space 312, a heating member 313 may be installed in the treating bath 311. The heating member 313 may heat the temperature of the treating liquid L stored in the accommodation space 312 of the treating bath 311 to a set temperature based on the temperature of the treating liquid L sensed by the temperature sensor which is not shown.

The supply line 314 may supply the treating liquid L to the accommodation space 312. The recollecting line 315 may drain the treating liquid L in the accommodation space 312. A valve is installed in each of the supply line 314 and the recollecting line 315, and the liquid level (i.e., the amount of the liquid L stored in the accommodation space 312) can be adjusted to a set level based on the liquid level of the treating liquid L sensed by the liquid level sensor (not shown).

The support member 316 may be disposed in the accommodation space 312 to support the substrate W. The support member 316 may be configured to support a plurality of substrates W. For example, the support member 316 may be configured to support 50 substrates W. The support member 316 may be arranged so that a pair of rod-shaped bodies face each other, and a support groove (not illustrated) through which the substrate W can be supported is formed in each body.

Referring back to FIG. 1, the transfer unit 330 may transfer the substrate W between the posture changing unit 20, the first batch-type treating bath 310, and the second batch-type treating bath 320.

The transfer unit 330 may include a rail extending along the first direction X and a hand configured to transfer the plurality of substrates W at once. The transfer unit 330 may hold the substrate W whose posture has been changed in the posture change treating bath 210 and transfer the gripped substrate W to the second process treating unit 30. The transfer unit 330 may hold the substrates W whose posture has been changed in the posture change treating bath 210 and transfer the substrates W to the first batch-type treating bath 310. The transfer unit 330 may hold the substrate W on which the liquid treatment has been completed in the first batch-type treating bath 310 and transfer it to the second batch-type treating bath 320. The transfer unit 330 may hold the substrate W that has been treated with liquid in the second batch-type treating bath 320 and transfer it to the posture change treating bath 210.

Figure 9:
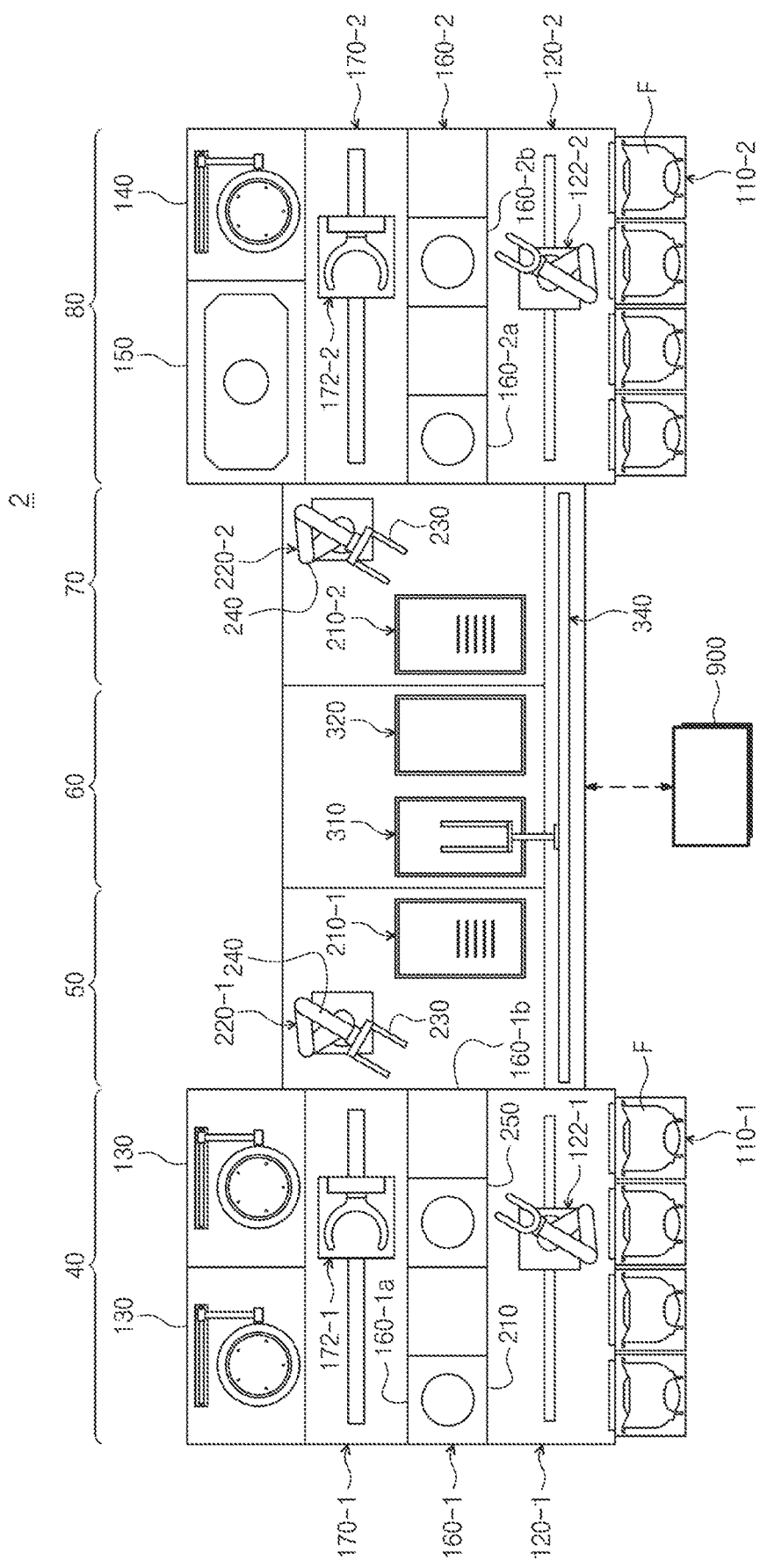
FIG. 9 is a schematic top view of the substrate treating apparatus according to another embodiment of the inventive concept.

FIG. 9 is a schematic view of a substrate treating apparatus according to another embodiment of the inventive concept as viewed from above.

Referring to FIG. 9, the substrate treating apparatus 2 according to another embodiment of the inventive concept may include a first process treating unit 40, a first posture changing unit 50, a second process treating unit 60, a second posture changing unit 70, a third process treating unit 80, and a controller 900. The first process treating unit 40, the first posture changing unit 50, the second process treating unit 60, the second posture changing unit 70, and the third process treating unit 80 may be arranged in the first direction X when viewed from above. Hereinafter, when viewed from above, a direction perpendicular to the first direction X is referred to as the second direction Y, and the direction perpendicular to the first direction X and the second direction Y is referred to as the third direction Z.

Hereinafter, the substrate treating apparatus 2 according to another embodiment of the inventive concept will be described focusing on differences from the substrate treating apparatus 1 according to an embodiment of the inventive concept, and the same drawing number will be assigned to the same configuration, and redundant descriptions will be omitted.

The first process treating unit 40 may treat the substrate W in a single-type method. The first process treating unit 40 may load the substrate W in the horizontal position. The first process treating unit 10 may treat the substrate W in the horizontal posture. The first process treating unit 40 may include a first load port unit 110-1, a first index unit 120-1, a liquid treating unit 130, a first buffer unit 160-1, and a first transfer treating unit 170-1. The first load port unit 110-1 and the first index unit 120-1 may be referred to as a first index module, and the liquid treating unit 130, the first buffer unit 160-1, and the first transfer treating unit 170-1 may be referred to as a first process module.

The first load port unit 110-1 may include a plurality of load ports. A transfer container F in which at least one substrate W is stored may be placed on the load ports of the first load port unit 110-1. A plurality of substrates W may be stored in the transfer container F. For example, 25 substrates may be stored in the transfer container F. The transfer container F may be referred to as a cassette, a pod FOD, a FOUP, or the like. The transfer container F may be loaded onto the first load port unit 110-1 by a container transfer apparatus (in an embodiment, an OHT). Only the container F in which the untreated substrate W is stored may be placed on the first load port unit 110-1. That is, the first load port unit 110-1 may only serve to load the substrate W requiring a treatment.

The first index unit 120-1 may be coupled to the first load port unit 110-1. The first index unit 120-1 and the first load port unit 110-1 may be arranged in the second direction Y. The first index unit 120-1 may be disposed between the first load port unit 110-1 and the first buffer unit 160-1. The first index unit 120-1 may include a first index robot 122-1. The first index robot 122-1 may take out the untreated substrate W or the substrate W requiring a treatment from the container F mounted on the first load port unit 110-1. The first index robot 122-1 may take the substrate W into the first process module by taking the substrate W out of the container F. The first index robot 122-1 may take out the substrate W from the container F and transfer the substrate W to the liquid treating unit 130 or a first buffer unit 160-1 to be described later.

The first index robot 122-1 may have a hand capable of holding and transferring the substrate W. The hand of the first index robot 122-1 may be a single-type hand for transferring the substrate W one by one. The hand of the first index robot 122-1 may be provided to be movable along the first direction X, the second direction Y, and the third direction Z. In addition, the hand of the first index robot 122-1 may be rotatably provided with the third direction Z as a rotation axis.

The first process treating unit 40 may be provided with a liquid treating unit 130 for treating a substrate in a single-type method. A plurality of liquid treating units 130 may be provided. The plurality of liquid treating units 130 may be provided and stacked in the vertical direction. The liquid treating unit 130 may be provided on a side surface of the first transfer treating unit 170-1 to be described later. The liquid treating unit 130 may face the first buffer unit 160-1 with respect to the first transfer treating unit 170-1. The liquid treating unit 130 may treat the substrate W by rotating the substrate W in a horizontal posture and supplying the first treating liquid to the rotating substrate W. The liquid treating unit 130 may treat the substrate W one by one. The first treating liquid supplied from the liquid treating unit 130 may be provided as a treating liquid capable of etching an oxide film on the substrate W. For example, the first treating liquid supplied from the liquid treating unit 130 may be provided as a treating liquid capable of etching the oxide film on the substrate W. In an embodiment, a dilute hydrofluoric acid (DHF) may be used as the first treating liquid. The liquid treating unit 130 may supply the first treating liquid to the rotating substrate W, and may rotate the substrate W to treat the substrate W.

The liquid treating unit 130 may have the same structure as the liquid treating unit 130 provided in the first process treating unit 10 of the substrate treating apparatus 1 according to an embodiment of the inventive concept. The liquid treating unit 130 may be provided with the same apparatus as the single-type substrate treating apparatus 400 of FIG. 2. Hereinafter, a redundant description of the liquid treating unit 130 of the substrate treating apparatus 2 according to another embodiment will be omitted.

The first buffer unit 160-1 may provide a storage space for temporarily storing the substrate W. The first buffer unit 160-1 may temporarily store the untreated substrate W or the substrate W requiring a treatment. In addition, the first buffer unit 160-1 may temporarily store the substrate W treated by the liquid treating unit 130. The first buffer unit 160-1 may include a plurality of first buffer units 160-1, and each of the plurality of first buffer units 160-1 may store a substrate W treated by the liquid treating unit 130 or an untreated substrate W transferred through the index robot 122.

The first buffer unit 160-1 may be disposed on any one of both side surfaces of the first transfer treating unit 170-1 to be described later. The first buffer unit 160-1 may face the liquid treating unit 130 based on the first transfer treating unit 170-1. The first buffer unit 160-1 may include a plurality of first buffer units 160-1. When viewed from above, the plurality of first buffer units 160-1 may be arranged in the first direction X. Some of the plurality of first buffer units 160-1 may store the untreated substrate W transferred from the first index robot 122-1 of the first index unit 120-1 or the substrate W requiring a treatment (hereinafter, 1-1 buffer unit 160-1*a*). Another part of the plurality of first buffer units 160-1 may store a substrate W that has been liquid-treated in the liquid treating unit 130 in a single-type method (hereinafter, referred to as a 1-2 buffer unit 160-1*b*). In an embodiment, the 1-1 buffer unit (160-1*a*) in which the liquid-treated substrate W is stored in the liquid treating unit 130 may be provided adjacent to the first posture changing unit 50 to be described later than the 1-2 buffer unit 160-1*b* in which the untreated substrate W or the substrate W requiring a treatment is stored.

The 1-1 buffer unit 160-1*a* may be opened toward the first transfer treating unit 170-1. Accordingly, the untreated substrate W transferred to the 1-1 buffer unit 160-1*a* or the substrate W requiring a treatment may be taken out by the first transfer robot 172-1 of the first transferring treating unit 170-1. The substrate W taken out from the 1-1 buffer unit 160-1*a* by the first transfer robot 172-1 may be transferred to the liquid treating unit 130 to be liquid-treated in a single-type method.

The 1-2 buffer unit 160-1*b* may be opened toward the first posture changing unit 50. Accordingly, the substrate W treated by the liquid treating unit 130 and stored in the 1-2 buffer unit 160-1*b* may be gripped by the first posture changing robot 220-1 and transferred to the first posture changing unit 50. In addition, the 1-2 buffer unit 160-1*b* may be opened toward the first transfer treating unit 170-1. Accordingly, the substrate W treated by the liquid treating unit 130 may be transferred to the 1-2 buffer unit 160-1*b* by the first transfer robot 172-1. The substrate W, which has been treated by the liquid treating unit 130 and stored in the 1-2 buffer unit 160-1*b*, may change its posture from the horizontal posture to a vertical posture by the first posture changing robot 220-1.

The first buffer unit 160-1 may be provided in the same structure as the buffer unit 160 provided in the first process treating unit 10 of the substrate treating apparatus 1 according to an embodiment of the inventive concept (see FIG. 4). In addition, the 1-1 buffer unit 160-1*a* and the 1-2 buffer unit 160-1*b* may have the same structure. Hereinafter, a redundant description of the first buffer unit 160-1 of the substrate treating apparatus 2 according to another embodiment will be omitted.

The first transfer treating unit 170-1 may be provided between the liquid treating unit 130 and the first buffer unit 160-1. The liquid treating unit 130 may be provided on a side of the first transfer treating unit 170-1, and a first buffer unit 160-1 may be provided on the other side. The first transfer treating unit 170-1 may have a first transfer robot 172-1. The first transfer robot 172-1 may have a single-type transfer hand for transferring the substrate W one by one. The first transfer robot 172-1 may transfer the substrate W between the liquid treating unit 130 and the first buffer unit 160-1. The first transfer robot 172-1 may take out the untreated substrate W or the substrate W requiring a treatment from the first buffer unit 160-1 and transfer it to the liquid treating unit 130. The first transfer robot 172-1 may transfer the untreated substrate W taken into the 1-1 buffer unit 160-1*a* or the substrate W required to be treated to the liquid treating unit 130. The first transfer robot 172-1 may take out the substrate W treated by the liquid treating unit 130 and transfer the substrate W to the 1-1 buffer unit 160-1*a*. In this case, the first posture changing robot 220-1 may transfer the liquid-treated substrate W stored in the 1-2 buffer unit 160-1*b* to the first posture changing unit 50.

The posture of the substrate W of the first posture changing unit 50 may be changed. The first posture changing unit 50 may be positioned between the first process treating unit 40 that treats the substrate W in a single-type method and the second process treating unit 60 that treats the substrate in a batch-type method. The first posture changing unit 50 may be positioned between the first process treating unit 40 that treats the substrate W in the horizontal posture and the second process treating unit 60 that treats the substrate W in the vertical posture. The first posture changing unit 50 may convert the posture of the substrate W from the horizontal posture to the vertical posture. The first posture changing unit 50 may change the substrate W treated in the horizontal posture in the first process treating unit 40 to the vertical posture.

The first posture changing unit 50 may be provided in the same structure as the posture changing unit 20 provided to the substrate treating apparatus 1 according to an embodiment. The first posture changing unit 50 may include a first posture changing treating bath 210-1 and a first posture changing robot 220-1. The first posture changing treating bath 210-1 is provided to have the same structure as the posture changing treating bath 210 of the posture changing unit 20 according to an embodiment of the inventive concept. In addition, the first posture changing robot 220-1 is provided to have the same structure as the posture changing robot 220 of the posture changing unit 20 according to an embodiment of the inventive concept. Hereinafter, redundant descriptions will be omitted.

The first posture changing robot 220-1 transfers the substrate W treated by the first process treating unit 40 to the first posture changing treating bath 210-1. The first posture changing robot 220-1 transfers the substrate W stored in the first buffer unit 160-1 to the first posture changing treating bath 210-1. The first posture changing robot 220-1 transfers the treated substrate W stored in the 1-2 buffer unit 160-1*b* to the first posture changing treating bath 210-1. The first posture changing robot 220-1 converts the posture of the substrate W from the horizontal posture to the vertical posture in the first posture changing treating bath 210-1.

The first posture changing treating bath 210-1 is provided in the same structure as the posture changing treating bath 210 according to an embodiment of the inventive concept (see FIG. 5). The first posture changing robot 220-1 is provided in the same structure as the posture changing robot 220 according to an embodiment of the inventive concept (see FIG. 6). Hereinafter, redundant descriptions will be omitted.

The second process processor 60 may treat the substrate W treated by the first process treating unit 40. The second process treating unit 60 may treat the liquid-treated substrate W in the first process treating unit 40. The second process treating unit 60 may collectively liquid treat a plurality of substrates W in a batch-type method. For example, the second process treating unit 60 may clean the plurality of substrates W in the batch-type method. The second process treating unit 60 may simultaneously process multiple substrates W in the vertical posture (a posture where the top or bottom surface of the substrate W is parallel to the direction perpendicular to the ground).

The second process treating unit 60 may include a first batch-type treating bath 310, a second batch-type treating bath 320, and a transfer unit 340. In the first batch-type treating bath 310, the plurality of substrates W may be simultaneously liquid-treated with the second treating liquid. The second treating liquid may be a chemical. The second treating liquid may be a chemical having the properties of a strong acid or a strong base. The chemical may include, for example, an ammonia-hydrogen peroxide mixture (APM), a hydrochloric acid-hydrogen peroxide mixture (HPM), a hydrofluoric acid-hydrogen peroxide mixture (FPM), a diluted sulfuric acid peroxide (DSP), a chemical including a SiN, a chemical including a phosphoric acid, and a chemical including a sulfuric acid.

In the second batch-type treating bath 320, the plurality of substrates W may be simultaneously liquid-treated with a third treating liquid. The second treating liquid may be a rinsing liquid. The rinsing liquid may be a liquid containing a water. For example, the rinsing liquid may be appropriately selected from a pure water or ozone water.

Each of the first batch-type treating bath 310 and the second batch-type treating bath 320 is provided to have the same structure as the first batch-type treating bath 310 and the second batch-type treating bath 320 according to an embodiment of the inventive concept. Hereinafter, redundant descriptions will be omitted.

The transfer unit 340 may transfer the substrate W between the first posture changing unit 50, the second process treating unit 60, and the second posture changing unit 70. The transfer unit 340 may transfer the substrate W between the first posture changing treating bath 210-1, the first batch-type treating bath 310, the second batch-type treating bath 320, and the second posture changing treating bath 210-2.

Referring to FIG. 9, the transfer unit 340 may include a rail extending along the first direction X and a hand configured to carry a plurality of substrates W at once. The transfer unit 340 may hold the substrates W which posture has been changed in the first posture changing treating bath 210-1 and transfer the gripped substrate W to the second process treating unit 60. The transfer unit 340 may hold a plurality of substrates W in a vertical posture in the first posture changing treating bath 210-1, and transfer the plurality of substrates W to the first batch-type treating bath 310.

The transfer unit 340 may hold the treated substrates W in the first batch-type treating bath 310 and transfer them to the second batch-type treating bath 320. The transfer unit 340 may hold the substrate W that has been treated with liquid in the second batch-type treating bath 320 and transfer it to the second posture changing treating bath 210-2. When the substrate W needs to be treated with the second treating liquid in the first batch-type treating bath 310 and the third treating liquid in the second batch-type treating bath 320, the transfer unit 340 may repeatedly transfer the substrate W between the first batch-type treating bath 310 and the second batch-type treating bath 320.

The second posture changing unit 70 may change the posture of the substrate W. The second posture change unit 70 may be disposed between the second process treating unit 60 that treats the substrate in a batch-type method and the third treating unit 80 that treats the substrate W in a single-type method. The second posture changing part 70 may be positioned between the second process treating unit 60 that treats the substrate W in the vertical posture and the third process treating unit 80 that treats the substrate W in the horizontal posture. The second posture changing unit 70 may convert the posture of the substrate W from the vertical posture to the horizontal posture.

The second posture changing unit 70 may be provided in the same structure as the posture changing unit 20 provided to the substrate treating apparatus 1 according to an embodiment. The second posture change unit 70 may include a second posture changing treating bath 210-2 and a second posture changing robot 220-2. The second posture changing treating bath 210-2 is provided to have the same structure as the posture changing treating bath 210 of the posture changing unit 20 in accordance with an embodiment of the inventive concept. The second posture changing robot 220-2 is provided to have the same structure as the posture changing robot 220 of the posture changing unit 20 according to an embodiment of the inventive concept. Hereinafter, redundant descriptions will be omitted.

The second posture changing robot 220-2 transfers the substrate W treated by the second process treating unit 60 to the second posture changing treating bath 210-2. The second posture changing robot 220-2 changes the posture of the substrate W stored in the second posture changing treating bath 210-2. The second posture changing robot 220-2 changes the posture of the substrate W stored in the second posture changing treating bath 210-2 from the horizontal posture to the vertical posture. The second posture changing robot 220-2 grips a plurality of substrates W converted into the vertical posture and transfers the plurality of substrates W to the second buffer unit 160-2 of the third process treating unit 80.

The second posture changing treating bath 210-2 is provided in the same structure as the posture changing treating bath 210 according to an embodiment of the inventive concept (see FIG. 5). The second posture changing robot 220-2 is provided in the same structure as the posture changing robot 220 according to an embodiment of the inventive concept (see FIG. 6). Hereinafter, redundant descriptions will be omitted.

The third process treating unit 80 may treat the substrate W in a single-type method. The third process treating unit 80 may unload the substrate W in the horizontal posture. The third process treating unit 80 may treat the substrate W in the horizontal posture. The third process treating unit 80 may include a second load port unit 110-2, a second index unit 120-2, an organic solvent treating unit 140, a drying treating unit 150, a second buffer unit 160-2, and a second transfer treating unit 170-2. The second load port unit 110-2 and the second index unit 120-2 may be referred to as a second index module, and the organic solvent treating unit 140, the drying treating unit 150, the second buffer unit 160-2, and the second transport treating unit 170-2 may be referred to as a second process module.

The second load port unit 110-2 may include a plurality of load ports. A transfer container F in which at least one substrate W is stored may be placed on the load ports of the second load port unit 110-2. A plurality of substrates W may be stored in the transfer container F. For example, 25 substrates may be stored in the transfer container F. The transfer container F may be referred to as a cassette, a pod FOD, a FOUP, or the like. The transfer container F may be unloaded from the second load port unit 110-2 by a container transport device (e.g., OHT). The transfer container F placed in the second load port unit 110-2 may store the substrates W treated in the first process treating unit 40, the second treating unit 60, and the third treating unit 80. The transfer container F placed in the second load port unit 110-2 may store only the substrate W treated in the first process treating unit 40, the second treating unit 60, and the third treating unit 80. That is, the second load port unit 110-2 may perform a function of unloading the treated substrate W from the substrate treating apparatus.

The second index unit 120-2 may be coupled to the second load port unit 110-2. The second index unit 120-2 and the second load port unit 110-2 may be arranged in the second direction Y. The second index portion 120-2 may be disposed between the second load port unit 110-2 and the second buffer portion 160-2. The second index unit 120-2 may include a second index robot 122-2. The second index robot 122-2 may take out the treated substrate W taken into the second buffer unit 160-2 and transfer it to the container F mounted on the second load port unit (110-2). The container F may be transferred to the outside of the substrate treating apparatus 2 by an article transfer apparatus (e.g., OHT).

The second index robot 122-2 may have a hand capable of holding and transferring the substrate W. The hand of the second index robot 122-2 may be a single-type hand for transferring the substrate W one by one. The hand of the second index robot 122-2 may be provided to be movable along the first direction X, the second direction Y, and the third direction Z. In addition, the hand of the second index robot 122-2 may be rotatably provided with the third direction Z as a rotation axis.

The organic solvent treating unit 140 may be provided with the substrate treating apparatus in which a liquid treating is performed in a single-type method. The substrate treating apparatus provided to the organic solvent treating unit 140 may have the same structure as the substrate treating apparatus 400 provided to the liquid treating unit 130 shown in FIG. 2. Thus, the same drawing number is assigned to the same structure, and a redundant description is omitted.

A plurality of organic solvent treating units 140 may be provided. The plurality of organic solvent treating units 140 may be provided and stacked in the vertical direction. The organic solvent treating unit 140 may be disposed on a side of the first transfer treating unit 170-1. The organic solvent treating unit 140 may face the second buffer unit 160-2 based on the first transfer treating unit 170-1. When viewed from above, the organic solvent treating unit 140 may be arranged in the first direction X with the dry treating unit 150.

The organic solvent treating unit 140 may treat the substrate W one by one. The organic solvent treating unit 140 may treat the substrate W in the horizontal posture one by one. The organic solvent treating unit 140 may treat the substrate W by rotating the substrate W in the horizontal posture and supplying the treating liquid to the rotating substrate W. The treating liquid supplied from the organic solvent treating unit 140 may be substituted with the rinsing liquid to be provided as a liquid capable of removing the rinsing liquid remaining on the surface of the substrate W. For example, the treating liquid supplied from the organic solvent treating unit 140 may be an organic solvent. For example, the treating liquid supplied from the organic solvent treating unit 140 may be an isopropyl alcohol (IPA).

The organic solvent treating unit 140 may supply the organic solvent to the substrate W in a rotating horizontal posture, and may dry the substrate W by rotating the substrate W. In contrast, the organic solvent treating unit 140 supplies the organic solvent to the rotating horizontal substrate W, and is transferred to the dry treating unit 150 described later while the substrate W is wet with the organic solvent, so that the substrate W may be dried in the dry treating unit 150.

The dry treating unit 150 may be provided with the substrate treating apparatus 500 in which a dry treating of the substrate is performed in a single-type method. The dry treating unit 150 may remove the treating liquid remaining on the substrate W using the drying fluid in a supercritical state. The dry treating unit 150 may be provided as a supercritical chamber to remove a treating liquid (e.g., a rinsing liquid or an organic solvent) remaining on the substrate W using a supercritical fluid. For example, the substrate treating apparatus 500 provided in the dry treating unit 150 may perform a drying process of removing the organic solvent remaining on the substrate W using supercritical carbon dioxide ($CO_2$).

The dry treating unit 150 provided in the substrate treating apparatus 2 according to another embodiment of the inventive concept may have the same structure as the dry treating unit 150 provided in the first process treating unit 10 of the substrate treating apparatus 1 according to an embodiment of the inventive concept. That is, the substrate treating apparatus 500 provided in the dry treating unit 150 according to another embodiment may be provided in the same manner as the substrate treating apparatus 500 provided in the dry treating unit 150 according to an embodiment. Hereinafter, redundant descriptions will be omitted.

The second buffer unit 160-2 may provide a storage space for temporarily storing the substrate W. The second buffer unit 160-2 may temporarily store the substrate W treated by the second process treating unit 60. The second buffer unit 160-2 may store the substrate W whose posture is changed in the second posture changing unit 70. The second buffer unit 160-2 may temporarily store the substrate W treated by the organic solvent treating unit 140 and/or the dry treating unit 150.

The first buffer unit 160-1 may be disposed on a side of the second transfer treating unit 170-2. The first buffer unit 160-1 may face the organic solvent treating unit 140 and/or the dry treating unit 150 with respect to the second transfer treating unit 170-2.

The second buffer unit 160-2 may include a plurality of second buffer units 160. Some of the plurality of second buffer units 160-2 may temporarily store the substrate W treated by the second process treating unit 60 and/or the substrate W whose which has changed in the second posture changing unit 70 (hereinafter, referred to as the 2-1 buffer unit 160-2a). The other part of the plurality of second buffer units 160-2 may temporarily store the substrate W treated by the organic solvent treating unit 140 and/or the dry treating unit 150 (hereinafter, referred to as the 2-2 buffer unit 160-2b). The 2-1 buffer unit 160-2a may be disposed closer to the second posture changing unit 70 than the 2-2 buffer unit 160-2b.

The 2-1 buffer unit 160-2a may be opened toward the second posture changing unit 70 when viewed from above. Accordingly, the 2-1 buffer unit 160-2a may be transferred to the 2-1 buffer unit 160-2a by the second transfer robot 172-2 with the substrate W treated by the second process treating unit 60 or the substrate W which posture has been changed by the second posture changing unit 70. In addition, the 2-1 buffer unit 160-2a may be opened toward the transfer treating unit 170 when viewed from above. Accordingly, the substrate W stored in the 2-1 buffer unit 160-2a may be transferred to the organic solvent treating unit 140 and/or the dry treating unit 150 through the second transfer robot 172-2.

The 2-2 buffer unit 160-2b may be opened toward the second transfer treating unit 170-2 when viewed from above. Accordingly, the substrate W treated by the organic solvent treating unit 140 and/or the dry treating unit 150 may be transferred to the 2-1 buffer unit 160-2a through the second transfer robot 172-2. The treated substrate W may be transferred to the second load port unit 110-2 by the index robot 122.

The second buffer unit 160-2 may be provided in the same structure as the buffer unit 160 provided in the first process treating unit 10 of the substrate treating apparatus 10 according to an embodiment of the inventive concept (see FIG. 4). Hereinafter, a redundant description will be omitted.

The second transfer treating unit 170-2 may be provided between the organic solvent treating unit 140 and the second buffer unit 160-2. The second transfer treating unit 170-2 may be provided between the dry treating unit 150 and the second buffer unit 160-2. An organic solvent treating unit 140 and a dry treating unit 150 may be provided on a side of the transfer treating unit 170. A second buffer unit 160-2 may be provided on the other side of the second transfer treating unit 170-2. The second transfer treating unit 170-2 may have a second transfer robot 172-2. The second transfer robot 172-2 may have a single-type transfer hand for transferring a substrate W by one by one. The second transfer robot 172-2 may transfer the substrate W between the organic solvent treating unit 140, the dry treating unit 150, and the buffer unit 160.

The second transfer robot 172-2 may take out the substrate W from the 2-1 buffer unit 160-2a and transfer the substrate W to the organic solvent treating unit 140. The second transfer robot 172-2 may transfer the substrate W treated by the organic solvent treating unit 140 to the dry treating unit 150. The second transfer robot 172-2 may supply the organic solvent from the organic solvent treating unit 140 to the 2-2 buffer unit 160-2b, which means that the substrate W is dried by rotating the substrate W while the substrate W is wet into the organic solvent. The second transfer robot 172-2 may transfer the substrate W treated by the dry treating unit 150 to the 2-2 buffer unit 160-2b.

The controller 900 may control the substrate treating apparatus 1 and 2. For example, the controller 900 may control components of the substrate treating apparatus 1 and 2. For example, the controller 900 may control the substrate treating apparatus 1 and 2 so that the substrate treating apparatus 1 and 2 may perform a process of treating the substrate W.

The controller may comprise a process controller consisting of a microprocessor (computer) that executes a control of the substrate treating apparatus, a user interface such as a keyboard via which an operator inputs commands to manage the substrate treating apparatus, and a display showing the operation situation of the substrate treating apparatus, and a memory unit storing a treating recipe, i.e., a control program to execute treating processes of the substrate treating apparatus by controlling the process controller or a program to execute components of the substrate treating apparatus according to data and treating conditions. In addition, the user interface and the memory unit may be connected to the process controller. The treating recipe may be stored in a storage medium of the storage unit, and the storage medium may be a hard disk, a portable disk, such as a CD-ROM or a DVD, or a semiconductor memory, such as a flash memory.

Figure 10:
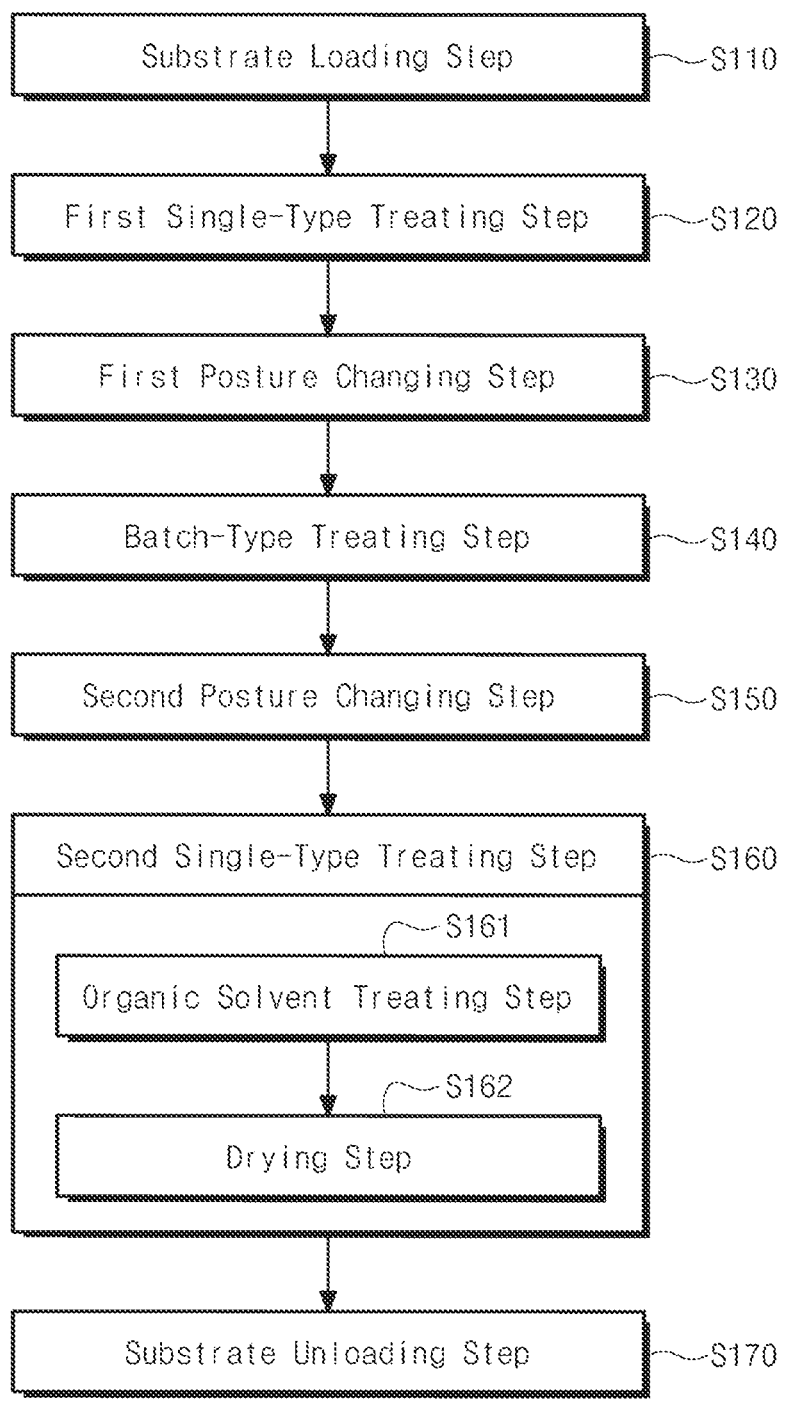
FIG. 10 is a flowchart illustrating a substrate treating method using the substrate treating apparatus of FIG. 1 or the substrate treating apparatus of FIG. 2.
Figure 11:
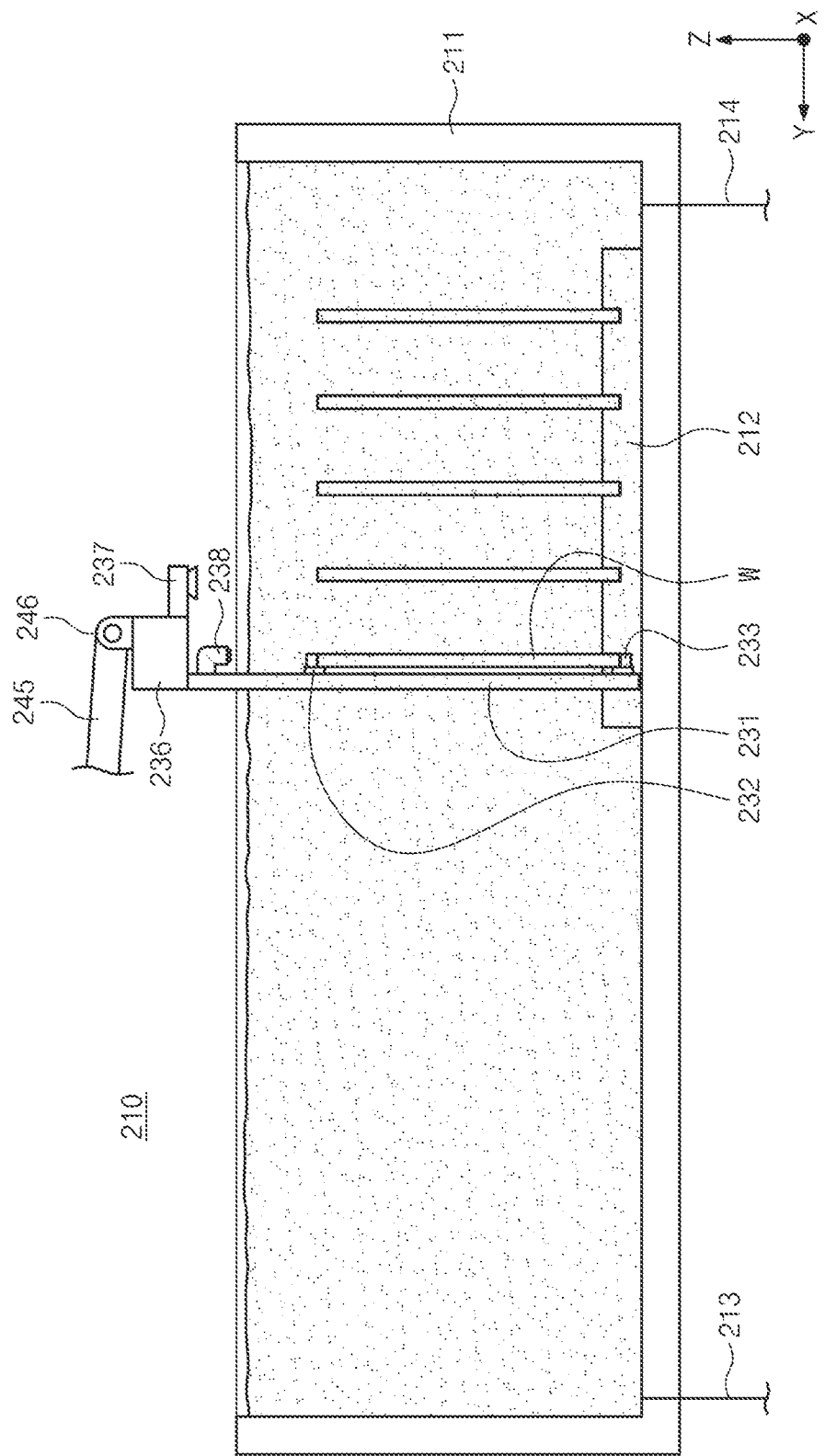
FIG. 11 and FIG. 12 illustrates a state in which the posture changing robot changes a posture of a substrate to a horizontal posture in a second posture changing step of FIG. 10.
Figure 12:
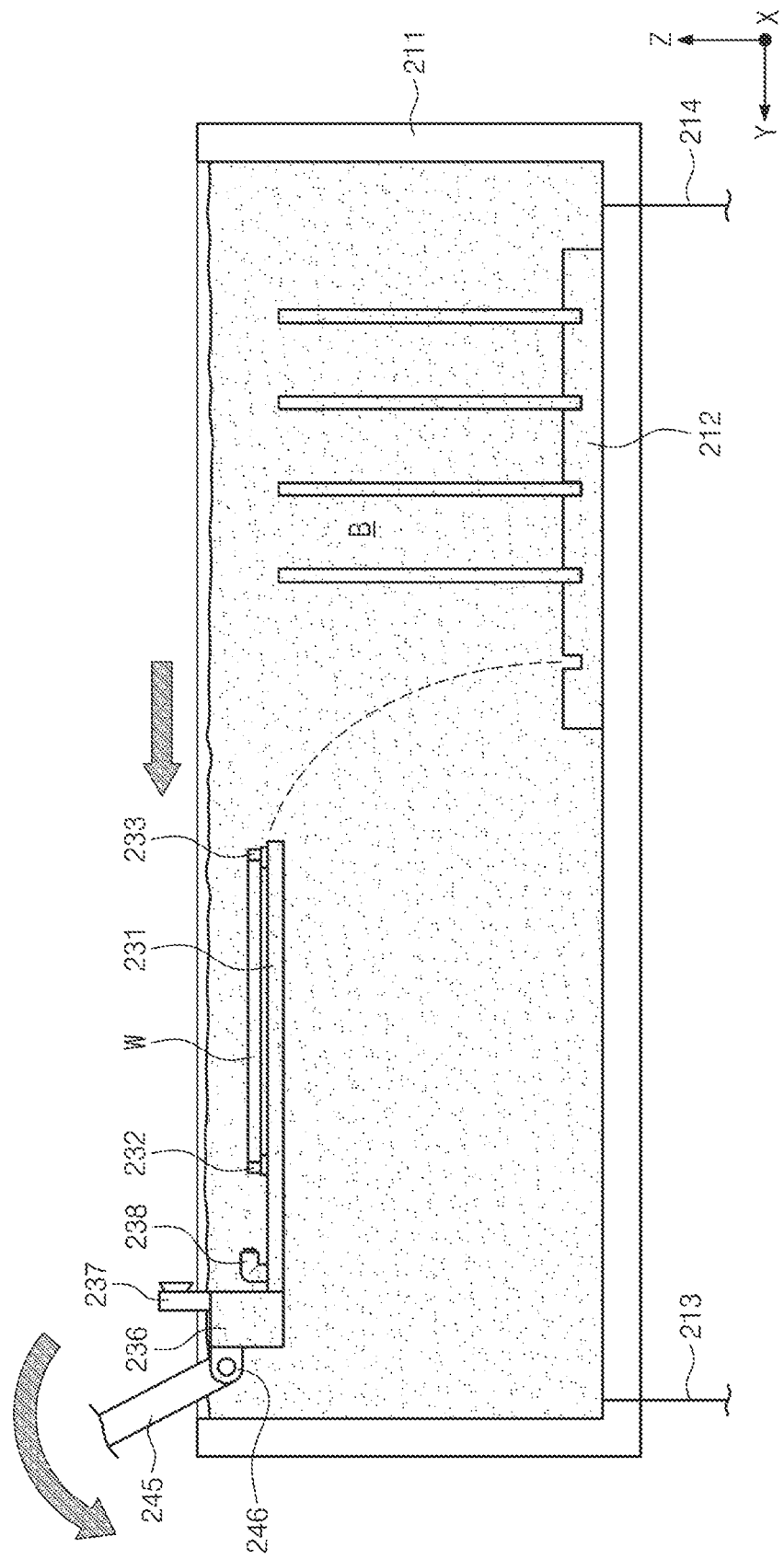
Figure 13:
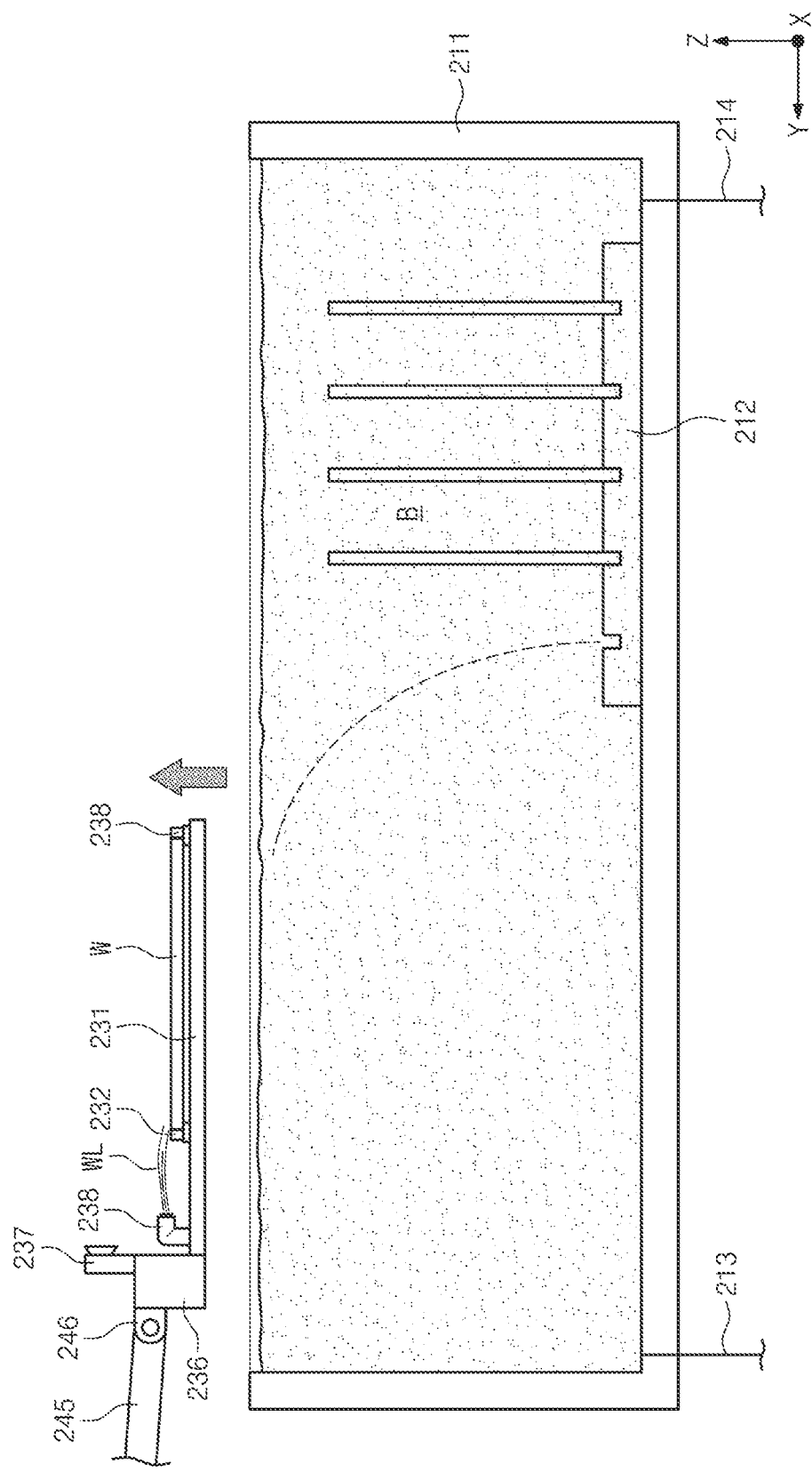
FIG. 13 illustrates the posture changing robot performing a wetting step of FIG. 10.
Figure 14:
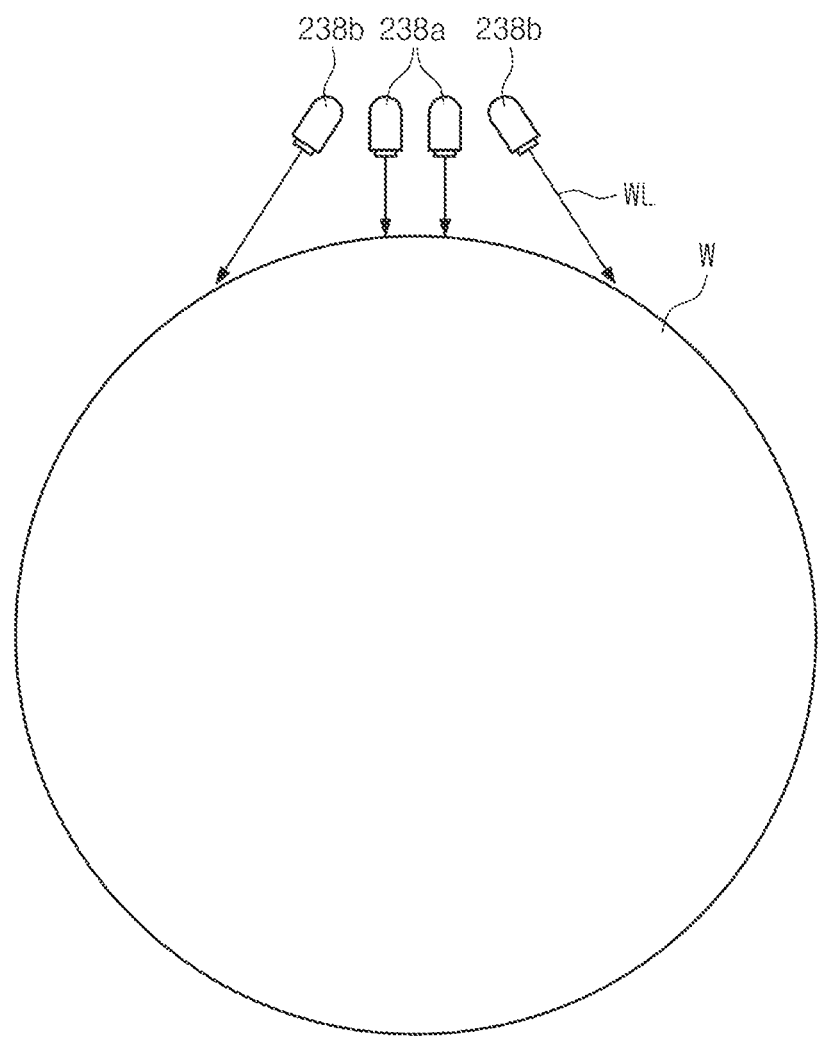
FIG. 14 is a top view illustrating a state in which a liquid supply member supplies a wetting liquid at the wetting step of FIG. 9.
Figure 15:
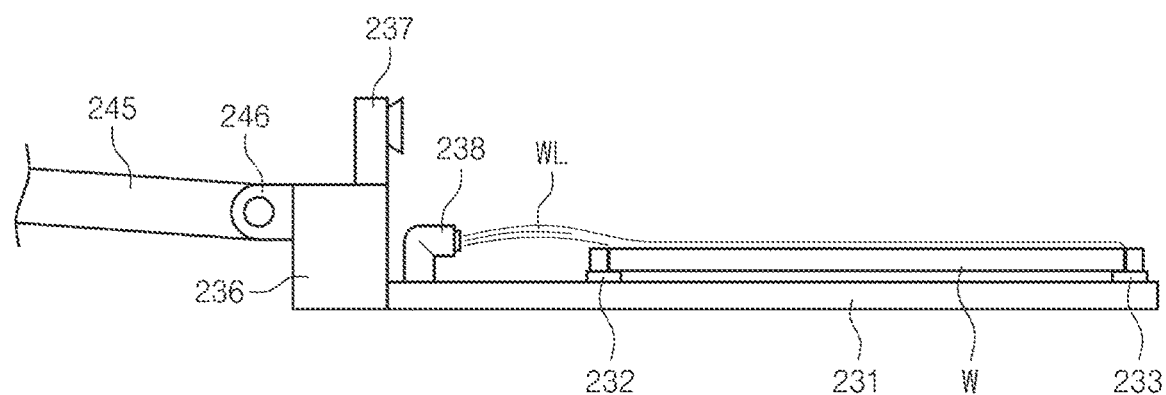
FIG. 15 is a side view illustrating a state in which the liquid supply member supplies the wetting liquid at the wetting step of FIG. 10.
Figure 16:
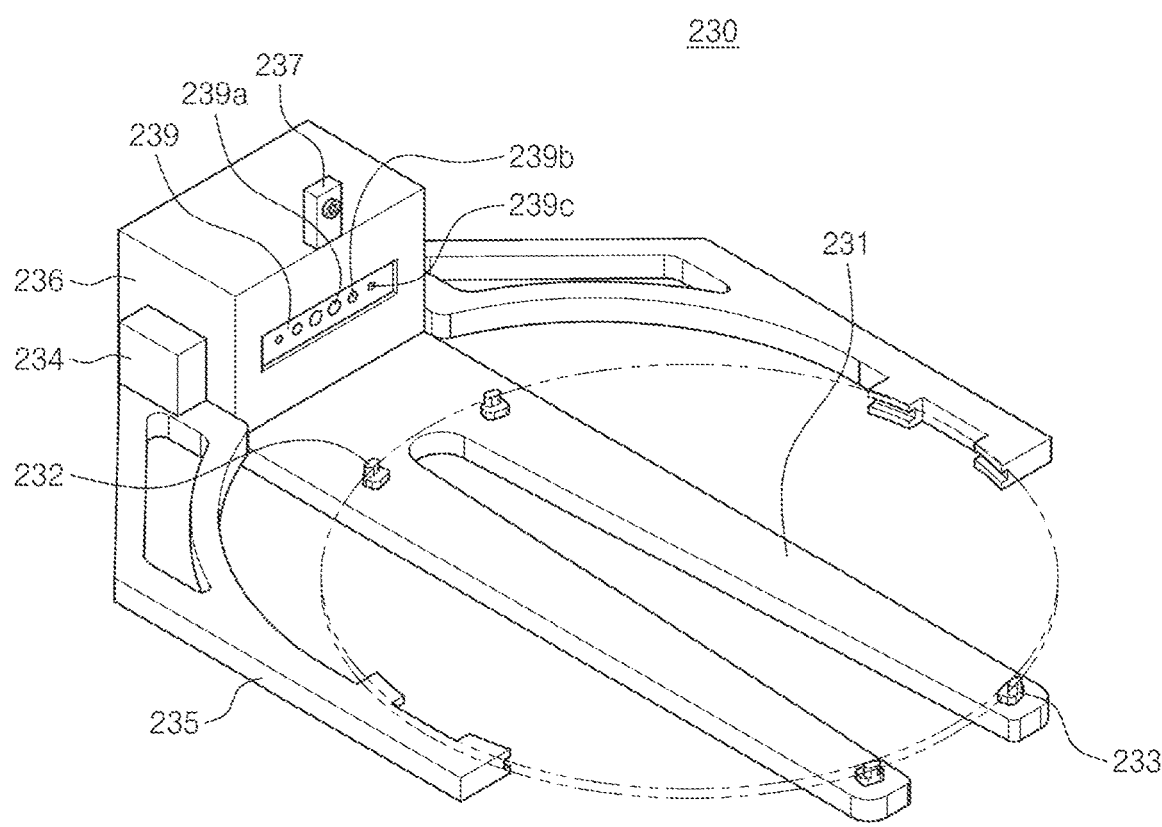
FIG. 16 illustrates the hand according to another embodiment of the inventive concept.
Figure 17:
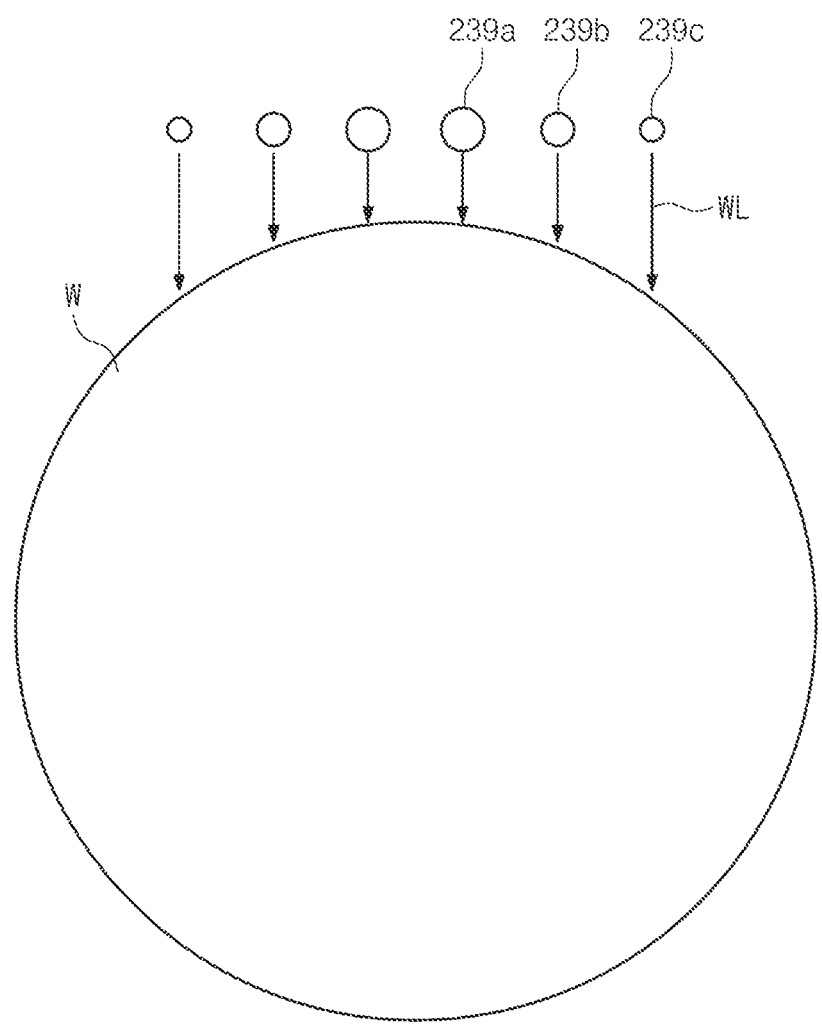
FIG. 17 is a top view illustrating a state in which the liquid supply member of FIG. 15 supplies the wetting liquid to the substrate.

FIG. 10 is a flowchart illustrating a substrate treating method using the substrate treating apparatus of FIG. 1 or the substrate treating apparatus of FIG. 2. FIG. 11 and FIG. 12 illustrate a posture changing robot changing the posture of a substrate to the horizontal posture in a second posture changing step of FIG. 10. FIG. 13 illustrates the posture changing robot performing the wetting step of FIG. 10. FIG. 14 is a top view illustrating a state in which the liquid supply member supplies the wetting liquid in the wetting step of FIG. 10. FIG. 15 is a side view of a state in which the liquid supply member supplies the wetting liquid in the wetting step of FIG. 19. FIG. 16 illustrates a hand according to another embodiment of the inventive concept. FIG. 17 is a top view illustrating a state in which the liquid supply member of FIG. 16 supplies the wetting liquid to the substrate.

Referring to FIG. 10, the substrate treating method S100 according to an embodiment of the inventive concept may include a substrate loading step S110, a first single-type treating step S120, a first posture changing step S130, a batch-type treating step S140, a second posture changing step S150, a second single-type treating step S160, and a substrate unloading step S170.

In the substrate loading step S110, a so-called substrate W in an untreated state, which requires treating, may be loaded on the substrate treating apparatus 1 and 2. In the substrate loading step S110, a transfer container F may be placed on the first load port unit 110-1.

In the substrate treating apparatus 1 of FIG. 1, the substrate W stored in the transfer container F may be taken out by the index robot 122 and transferred to the buffer unit 160. In the substrate treating apparatus 2 of FIG. 9, the substrate W stored in the transfer container F may be taken out by the first index robot 122-1 and transferred to the first buffer unit 160-1. In the substrate treating apparatus 2 of FIG. 9, the substrate W stored in the transfer container F may be taken out by the first index robot 122-1 and transferred to the 1-1 buffer unit 160-1a.

In the first single-type treating step S120, the substrate W having a horizontal posture may be treated in a single-type method. In the first single-type treating step S120, the substrate W may be treated by supplying a first treating liquid capable of etching an oxide film to the substrate W. The first treating liquid may be a dilute hydrofluoric acid (DHF). In the first single-type treating step S120, the first treating liquid may be supplied to the substrate W, and the substrate W may be rotated to treat the substrate W.

In the substrate treating apparatus 1 of FIG. 1, the first transfer robot 172 may take out the substrate W from the buffer unit 160 and transfer it to the liquid treating unit 130. The first transfer robot 172 may transfer the substrate W taken out from the buffer unit 160 in the horizontal posture. The first transfer robot 172 may transfer the substrate W taken out from the buffer unit 160 to the substrate treating apparatus 400 of the liquid treating unit 130, and may seat the substrate W on the support unit 440 in the horizontal posture. The support unit 440 may rotate the substrate W. The liquid supply unit 480 may supply the first treating liquid to the rotating substrate W. The substrate W treated by the liquid treating unit 130 may be transferred to the buffer unit 160 by the first transfer robot 172.

In the substrate treating apparatus 1 of FIG. 2, the first transfer robot 172-1 can take out the substrate W from the 1-1 buffer unit 160a and transfer it to the liquid treating unit 130. The first transfer robot 172-1 may transfer the substrate W taken out from the 1-1 buffer unit 160-1a in the horizontal posture. The first transfer robot 172-1 transfers the substrate W taken out from the 1-1 buffer unit 160-1a to the substrate treating apparatus 400 of the liquid treating unit 130, and can seat the substrate W on the support unit 440 in a horizontal posture. The support unit 440 may rotate the substrate W. The liquid supply unit 480 may supply the first treating liquid to the rotating substrate W. The substrate W treated by the liquid treating unit 130 may be transferred to the 1-2 buffer unit 160-1a by the first transfer robot 172-1.

In the first posture changing step S130, the posture of the substrate W may be changed from the horizontal posture to the vertical posture. In the first posture changing step S130, the positions of the plurality of substrates W may be changed at once.

In the substrate treating apparatus 1 of FIG. 1, the posture of the plurality of substrates W placed on the buffer unit 160 may be changed at once by the posture changing unit 20. The posture changing robot 220 may transfer a plurality of substrates W stored in the horizontal position to the buffer unit 160 to the posture changing treating bath 211. The posture changing robot 220 may change the posture of a plurality of substrates W from the horizontal posture to the vertical posture in the posture changing treating bath 211. The substrate W changed to the vertical posture may be transferred to the first batch-type treating bath 310 of the second process treating unit 30 by the transfer unit 330.

In the substrate treating apparatus 2 of FIG. 9, the posture of the plurality of substrates W placed on the 1-2 buffer unit 160-2a may be changed at once by the first posture changing unit 50. The first posture changing robot 220-1 may transfer a plurality of substrates W stored in a horizontal position in the 1-2 buffer unit 160-1b to the first posture changing treating bath 210-1. The first posture changing robot 220-1 may change the posture of a plurality of substrates W from the horizontal posture to the vertical posture in the first posture changing treating bath 210-1. The substrate W changed to the vertical posture may be transferred to the first batch-type treating bath 310 of the second process treating unit 60 by the transfer unit 340.

In the batch-type treating step S140, a liquid treatment may be performed on the plurality of substrates W in the vertical posture. In the batch-type treating step S140, the plurality of substrates W may be simultaneously liquid-treated with the second treating liquid, and then the plurality of substrates W may be simultaneously treated with the third treating liquid. The second treating liquid may be a chemical having the properties of a strong acid or a strong base. The chemical may include, for example, an ammonia-hydrogen peroxide mixture (APM), a hydrochloric acid-hydrogen peroxide mixture (HPM), a hydrofluoric acid-hydrogen peroxide mixture (FPM), a diluted sulfuric acid peroxide (DSP), a chemical including a SiN, a chemical including a phosphoric acid, and a chemical including a sulfuric acid.

In the substrate treating apparatus 1 and 2 of FIGS. 1 and 9, the plurality of substrates W may be simultaneously treated with a second treating liquid in the first batch-type treating bath 310. If the treating is completed in the first batch-type treating bath 310, the transfer units 330 and 340 simultaneously transfer the plurality of substrates W stored in the first batch-type treating bath 310 to the second batch-type treating bath 320. In the second batch-type treating bath 320, the plurality of substrates W may be simultaneously liquid-treated with a third treating liquid.

In the substrate treating apparatus 1 of FIG. 1, if the treating is completed in the second batch-type treating bath 320, the plurality of substrates W rinse-treated with the third treating liquid may be transferred to the posture change unit 330. The transfer unit 330 may transfer the plurality of rinse-treated substrates W to the posture changing treating bath 210 at once.

In the substrate treating apparatus 2 of FIG. 9, if the treating is completed in the second batch-type treating bath 320, the plurality of substrates W rinse-treated with the third treating liquid may be transferred to the second posture changing unit 70 by the transfer unit 340. The transfer unit 340 may transfer the plurality of rinse-treated substrates W to the second posture changing treating bath 210-2 at once.

The second posture changing step S150 may be performed at the posture changing unit 20 in the substrate treating apparatus 1 of FIG. 1, and at a second posture changing unit 70 in the substrate treating apparatus 2 of FIG. 9. The second posture changing step S150 may include a holding step of holding the substrate W and a rotation step of changing the posture of the substrate W. A posture change of the substrate W may be performed by each sheet at the second posture changing step S150.

For example, as shown in FIG. 11, in the holding step of the second posture changing step S150, the hand 230 may approach any one of the substrates W supported by the support member 212 in a vertical posture. The hand 230 may be moved so that the substrate W may be positioned between the first guide portion 162 and the second guide portion 163. If the substrate W is positioned between the first guide portion 162 and the second guide portion 163, the chucking body 165 may hold the substrate W.

If the hand 230 holds the substrate W, the substrate W may be upwardly moved so that the substrate W may escape from the support groove formed at the support member 212.

Thereafter, as shown in FIG. 11, in the rotation step of the second posture changing step S150, the substrate W may be linearly moved along a direction (for example, a horizontal direction) to change the position of the substrate W while rotating the substrate W based on an axis of the fastening member 236. That is, in the rotation step, the hand 230 may rotate with respect to an axis, and the hand 230 may linearly move according to the horizontal direction. In this case, a position of an end of the substrate W may be changed while drawing a virtual curve (e.g., a cut parabola). That is, the posture of the substrate W may be changed from the vertical posture to the horizontal posture in a state immersed in the treating liquid L while drawing the cut parabola. Also, the rotation of the substrate W may be performed in a direction in which an end of the substrate W moves away from the hand 156-H.

In addition, a difference between a time at which a rotation of the substrate W ends and a time at which a linear movement of the substrate W ends may be less than or equal to a set time. For example, these two time points may be the same time point. That is, at a time point at which the linear movement of the substrate W is finished, the rotation of the substrate W by the fastening body 166 may be simultaneously be terminated.

In addition, while the substrate W is held and the substrate W is rotated, the vision member 167 may not be immersed in the treating liquid L. That is, the vision member 167 may be installed at a position which is not immersed in the treating liquid L stored in the posture changing treating bath 211, 210-1, and 210-2. Accordingly, it is possible to minimize a problem of the vision member 167 being damaged by the treating liquid L.

If the posture of the substrate W is changed to a state in which the substrate W is immersed in the treating liquid L, the substrate W may be damaged by a resistance of the treating liquid L. However, as in the inventive concept, if the posture is changed while the substrate W is immersed in the treating liquid L by linearly moving and rotating simultaneously, it is possible to suppress the resistance caused by the treating liquid L from being transferred to the substrate W as much as possible. In addition, if the substrate W is moved away from the treating liquid L (i.e., exposed to air) and the posture is changed, the wettability of the substrate W may not be maintained and a water mark may be generated on the substrate W, and this problem can be minimized by changing the posture of the substrate W while the substrate W is immersed in the treating liquid L.

After the second posture changing step S150 is performed, the wetting step (not shown) may be performed. The wetting step S50 may be performed between the second posture changing step S150 and the second single-type treating step S160.

In a case of the substrate treating apparatus of FIG. 1, the wetting step may be performed at the posture changing robot 220 and/or the buffer unit 160. In a case of the substrate treating apparatus 2 of FIG. 9, the wetting step may be performed by the second posture changing robot 220-2 and/or the 2-1 buffer unit 160-2a.

In the wetting step S50, a natural drying of the substrate W may be prevented by spraying the wetting liquid to the substrate W exposed to the outside away from the treating liquid L. The wetting liquid may be the same type of liquid as the treating liquid L stored in the above-described posture changing treating bath 220, 220-1, and 220-2. In contrast, the wetting liquid may be a type of liquid different from the above-described treating liquid L.

For example, as illustrated in FIG. 13, a posture changing of the substrate W is completed, and the posture changing robot 220 and 220-2 may upwardly move the substrate W to deviate from the treating liquid L stored at the posture changing treating bath 220 and 220-2. If the substrate W deviates from the treating liquid L, the liquid supply member 168 may supply the wetting liquid WL. In this case, as shown in FIG. 14 and FIG. 15, the wetting liquid WL may be supplied to the first region and the second region which are edge regions of the substrate W. The wetting liquid WL supplied to the edge region of the substrate W may flow along the top surface of the substrate W to form a liquid film on the top surface of the substrate W. If the wetting liquid WL flows along the edge region of the substrate W to form the liquid film, a splashing of the wetting liquid WL is maximally suppressed, thereby making a more efficient treatment of the substrate W possible.

Also, the wetting step S50 may be performed at the first buffer unit 210 as described above. The substrate W on which the second posture changing step S150 is performed may be transferred to the first buffer unit 210 by the posture changing robot 156. In the wetting step S30, if the substrate W is taken into the first buffer unit 210, the wetting nozzle 216 of the first buffer unit 210 may spray the wetting liquid to the substrate W.

As the wetting step S30 is performed, it is possible to minimize the natural drying of the substrate W before the substrate W is taken into the single-type treating chamber.

The single-type treating step S60 may include a liquid treating step S61 and a drying step S162.

In the second single-type treating step S160, treating may be performed on a single substrate W in the horizontal posture. The second single-type treating step S160 may include an organic solvent treating step S161 and a drying step S162. An organic solvent such as IPA may be supplied onto the substrate W to the organic solvent treating step S161. An organic solvent such as IPA may be supplied onto the substrate W to the organic solvent treating step S161.

The organic solvent treating step S161 may liquid treat the substrate W in a single-type method.

In the case of the substrate treating apparatus 1 of FIG. 1, if the substrate which is temporarily stored at the buffer unit 160 is transferred to the organic solvent treating unit 140, the the organic solvent treating step S161 may be performed at the organic solvent treating unit 140. In the case of the substrate treating apparatus 2 of FIG. 9, if the substrate W which is temporarily stored at the 2-2 buffer unit 160-2b is transferred to the organic solvent treating unit 140, the organic solvent treating step S161 may be performed at the organic solvent treating unit 140.

In the drying step S162, the substrate W may be dried in a single-type method. The drying step S162 can be performed at the dry treating chamber 150 if the substrate W which is liquid treated in the liquid treating step S161 is transferred to the dry treating chamber 150. In the drying step S162, a treating fluid in a supercritical state (e.g., supercritical carbon dioxide) may be supplied to the substrate W to remove an organic solvent, a wetting liquid, or a treating liquid L remaining on the substrate.

In some cases, the drying step S162 may not be performed at the dry treating unit 150, but the substrate W may be dried by rotating the substrate W at the organic solvent treating unit 140 at a high speed (so-called spin drying).

If the drying step 162 is completed, a substrate unloading step S170 of unloading the substrate W is performed.

In the case of the substrate treating apparatus in FIG. 1, in the substrate unloading step S170, the substrate W on which the second single-type treating step S160 is performed may be transferred to the buffer unit 160 and then transferred to the transfer container F placed on the second load port unit by the first transfer robot 172, and the transfer container F placed on the second load port unit may be held by an transfer apparatus such as an OHT to be unloaded from the substrate treating apparatus.

In the case of the substrate treating apparatus 2 of FIG. 9, in the substrate unloading step S170, the substrate W on which the second single-type treating step S160 is performed may be transferred to the 2-2 buffer unit 160-2b, and then transferred to the transfer container F placed on the second load port unit 110-2, and the transfer container F placed on the second load port unit 110-2 may be held by a transfer apparatus such as an OHT to be unloaded from the substrate treating apparatus 2.

As described above, the substrate treating apparatus 1 and 2 according to an embodiment of the inventive concept may include both a batch-type treating unit and a single-type liquid treating unit. Accordingly, it may have all the advantages of the batch-type liquid treating method and the single-type liquid treating method.

For example, since the batch-type treating unit 30 and 60 may treat a plurality of substrates W at once, a mass productivity of the substrate W treatment is excellent, and a treatment uniformity between the substrates W is very high. In addition, if the pattern formed on the substrate W has a high aspect ratio, the batch-type treating unit 30 and 60 may supplement a portion that has not quite been treated (e.g., a portion that has not quite been etched) by a single-type treatment of supplying a chemical, a rinsing liquid, etc.

In addition, the substrate W (e.g., a wafer) wetted by the organic solvent supplied from the organic solvent treating unit 140 may be transferred to the dry treating unit 150 for drying the substrate W by supplying a supercritical fluid. The supercritical fluid may have a high penetration force with respect to a space between patterns formed on the substrate W and may dry the substrate W without rotating the substrate W, thereby minimizing the above-described pattern leaning phenomenon. In addition, the substrate treating apparatus 1 and 2 of the inventive concept may perform all of the single-type liquid treating method, the batch-type liquid treating method, and the method of drying the substrate W using the supercritical fluid, thereby improving defects due to a particle, a falling, and a flowability. In addition, since the number of substrates W that can be treated at the batch-type treating unit 30 and 60 is relatively large, a large number of liquid treating chambers are not required, and thus a footprint of the substrate treating apparatus 10 may be reduced.

In addition, like the substrate treating apparatus 1 and 2 according to an embodiment of the inventive concept, if both the second process treating unit 30 and 60 which performs a batch-type treatment and the process treating unit batch-type treating unit 140 (10 in the case of FIGS. 1 and 40 and 80 in the case of FIG. 9) which performs a single-type treatment are both provided, it is essential to change the posture of the substrate W from the vertical posture to the horizontal posture. Accordingly, the substrate treating apparatus 1 and 2 according to an embodiment of the inventive concept includes a posture changing robot 220, 220-1, 220-2 to change the posture of the substrate W from the vertical posture to the horizontal posture. In this case, the posture change of the substrate W is conducted in a state in which the substrate W is immersed in the treating liquid L so as to maintain the wettability of the substrate W as much as possible (if not, the substrate W may dry and generate a water mark).

In the above-described example, it has been described that the liquid supply member 238 is installed on the support body 233, but the inventive concept is not limited thereto. For example, as shown in FIG. 16, the liquid supply member 239 may be installed on the fastening body 166. The liquid supply member 239 may be a supply pipe on which a first nozzle 239a, a second nozzle 239b, and a third nozzle 239c are formed. The first nozzle 239a, the second nozzle 239b, and the third nozzle 239c may spray the wetting liquid WL toward the substrate W in a downwardly inclined direction. At least one of the first nozzle 239a, the second nozzle 239b, and the third nozzle 239c may be formed. For example, a plurality of first nozzles 239a, a plurality of second nozzles 239b, and a plurality of third nozzles 239c may be formed. The first nozzles 239a may be disposed between the second nozzles 239b, and the second nozzles 239b may be disposed between the third nozzles 239c. The first nozzles 239a may be disposed relatively at an inner side, and the third nozzles 239c may be disposed relatively at an outer side. Also, as illustrated in FIG. 17, diameters of spray holes of the first nozzle 239a, the second nozzle 239b, and the third nozzle 239c may be different from each other. A diameter of the spray hole of the first nozzle 239a may be larger than that of the second nozzle 239b, and a diameter of the spray hole of the second nozzle 239b may be larger than that of the third nozzle 239c. Furthermore, a supply flow rate of the wetting liquid WL per unit time transferred to the first nozzle 239a, the second nozzle 239b, and the third nozzle 239c may be the same. Accordingly, regarding an injection distance of the wetting liquid WL supplied from the first nozzle 239a, the second nozzle 239b, and the third nozzle 239c, the first nozzle 239a may be the shortest, and the third nozzle 239c may be the longest. In addition, the first nozzle 239a, the second nozzle 239b, and the third nozzle 239c may supply the wetting liquid WL to the edge region of the substrate W.

Figure 18:
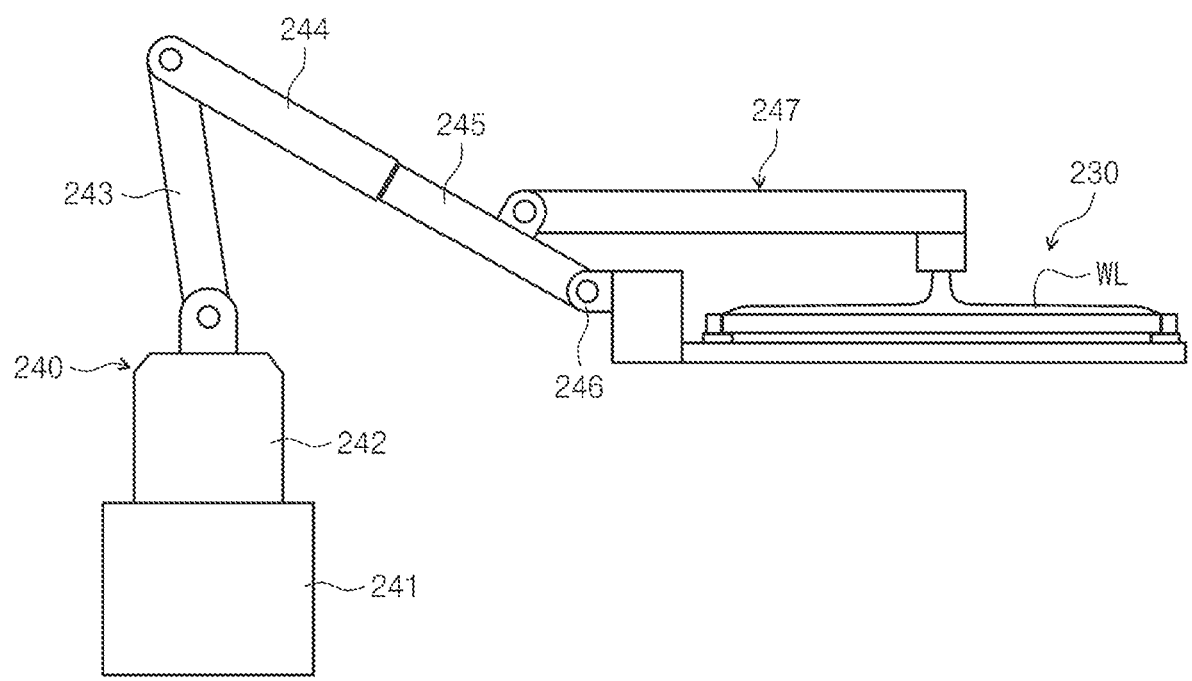
FIG. 18 illustrates the posture changing robot according to another embodiment of the inventive concept.

In the above-described example, it has been described that the posture changing robot 220, 220-1 and 220-2 supplies the wetting liquid WL to the edge region of the substrate W, but the inventive concept is not limited thereto. For example, as shown in FIG. 18, the liquid supply member 247 may be fastened to the third arm 175. In addition, the liquid supply member 247 may be provided to be rotatable with a direction parallel to a rotation axis of the fourth arm 176 as a rotation axis, and may be configured to supply the wetting liquid WL to a center region of the substrate W placed on the hand 231.

Figure 19:
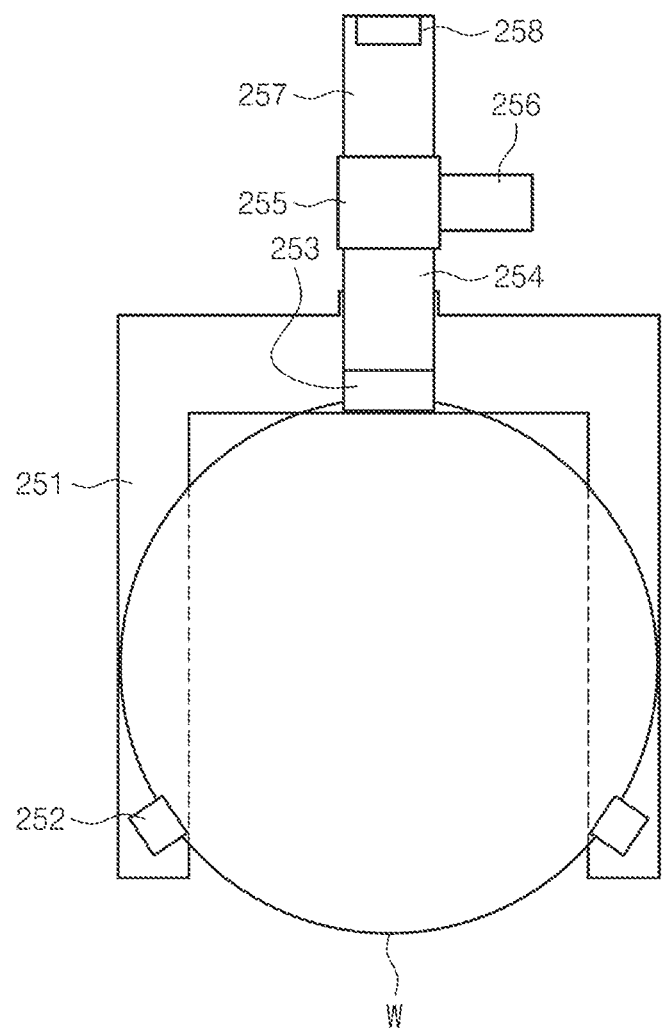
FIG. 19 is a top view of the hand according to another embodiment of the inventive concept.
Figure 20:
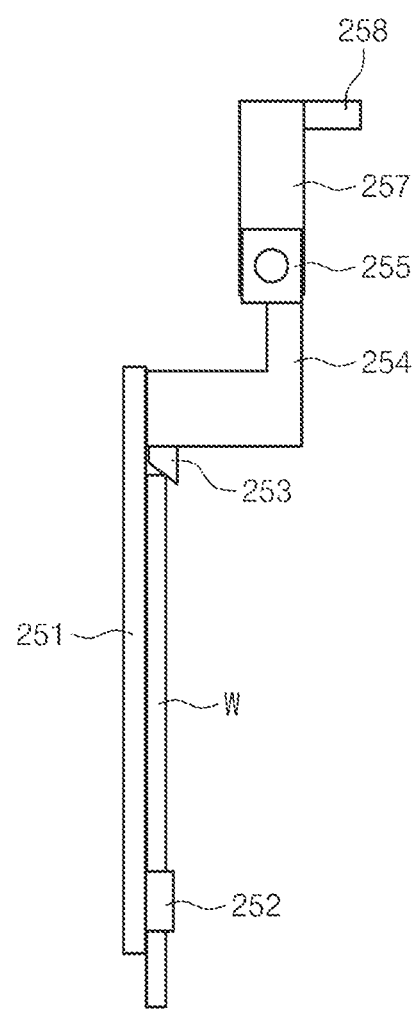
FIG. 20 is a side view of the hand of FIG. 18.

FIG. 19 is a top view of the hand according to another embodiment of the inventive concept, and FIG. 20 is a side view of the hand of FIG. 19.

Referring to FIG. 19 and FIG. 20, the hand 250 according to another embodiment that the posture changing robot 220, 220-1, and 220-2 may have may include a support body 251, a guide portion 252, a chucking body 253, a driving member 254, a rotation member 255, a rotation motor 256, a connection body 257, and a vision member 258.

The support body 251 may have a finger shape. The guide portion 252 may be provided at a distal end of the support body 251. The guide portion 252 may support a side portion of the substrate W, and the support body 251 may support the bottom surface of the substrate W.

The chucking body 253 may move in a direction by the driving member 254. The chucking body 253 may be moved between a chucking position for chucking the substrate W and a standby position for not chucking the substrate W by the driving member 254. The rotation member 255 may rotate the support body 251 and the substrate W based on an axis, and the rotation motor 255 may transfer a driving force for rotating the rotation member 256. The connection body 257 may be connected to the joint portion 156-R of the posture changing robot 220, 220-1, and 220-2. The vision member 258 may perform the same or a similar function as the above-described vision member 257. In addition, similar to the vision member 257, the vision member 258 may be installed at a position which is not immersed in the treating liquid L stored in the posture changing treating bath 151 when the posture of the substrate W is changed.

Figure 21:
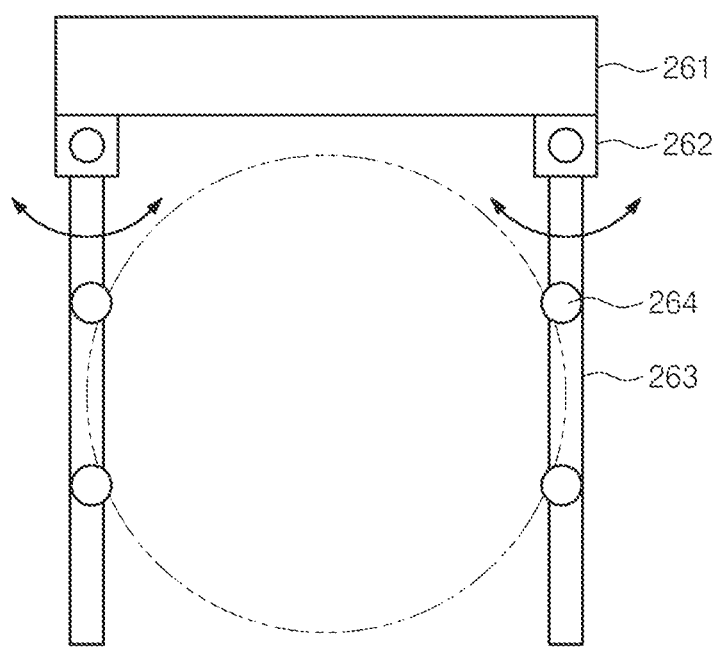
FIG. 21 is a top view of the hand according to another embodiment of the inventive concept.
Figure 22:
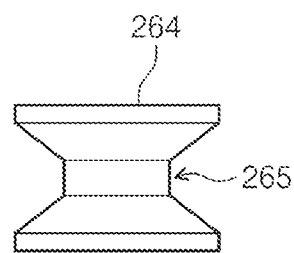
FIG. 22 is a side view of a holder of FIG. 19.

FIG. 21 is a top view of a hand according to another embodiment of the inventive concept, and FIG. 22 is a side view of the holder of FIG. 21. Referring to FIG. 21 and FIG. 22, the hand 260 of the posture changing robots 220, 220-1, 220-2 according to another embodiment of the inventive concept may include a fastening body 261, a rotating member 262, a chucking body 263, and a holder 264. The fastening body 261 may be coupled to the joint portion 156-R of the posture changing robots 220, 220-1, and 220-2. The rotation member 262 may rotate the chucking body 263. A plurality of grippers 264 may be installed in the chucking body 263. A hold groove 265 for holding a side portion of the substrate W may be formed in the holder 264.

In the above-described example, the substrate treating apparatus 1 and 2 according to an embodiment of the inventive concept includes both a liquid treating chamber unit 130, an organic solvent treating unit 140, and a dry treating chamber 150, but is not limited thereto. For example, the substrate treating apparatus 1 and 2 may include only one of the liquid treating unit 130, the organic solvent treating unit 140, and the dry treating chamber 150.

In the above-described example, the substrate W taken out from the batch-type treating unit 30 and 60 is transferred to the organic solvent treating unit 140, and after the substrate W treatment is completed at the organic solvent treating unit 140, the substrate W is transferred to the dry treating chamber 150. For example, if a particle level is good, the substrate W may be directly transferred to the dry treating unit 150 from the batch-type liquid treating unit 30 and 60.

In the above-described example, the liquid treating unit 130 may liquid treat the substrate W by a first treating liquid including a hydrofluoric acid or the like, and the first batch-type treating bath 310 may liquid treat the substrate with a second treating liquid including a phosphoric acid, but the inventive concept is not limited thereto. For example, the liquid treating unit 130 may treat the substrate with a second treating liquid containing a phosphoric acid, etc., and the substrate W may be batch-treated with a first treating liquid containing a hydrofluoric acid in the first batch-type treating bath 310.

The substrate treating apparatus 1 and 2 according to an embodiment of the inventive concept may minimize the number of batch-type treating baths included in the substrate treating apparatus 1 and 2 by configuring a substrate treatment according to the first treating liquid among the first to the third treating liquids in the single-type method and according to the second and the third treating liquids in the batch-type method. The batch-type treating bath has a problem in that the amount of fume generated by the treating liquid is higher than that of the single-type treating apparatus, and according to the embodiment of the inventive concept, the number of batch-type treating baths may be minimized.

In addition, the substrate treating apparatus 1, 2 according to the embodiment of this invention have the advantage of reducing a total length of the substrate treating apparatus 1, 2 by reducing the number of batch-type treating baths.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously take out the inventive concept without departing from the essence of the inventive concept claimed in the claims and the modifications should not be construed separately from the technical spirit or prospect of the inventive concept.

What is claimed is:

1. A substrate treating apparatus comprising:
   a first process treating unit configured to treat a substrate in a single-type method;
   a second process treating unit configured to treat a substrate in a batch-type method; and
   a posture changing unit configured to transfer the substrate between the first process treating unit and the second process treating unit and to change a posture of the substrate between a vertical posture and a horizontal posture,
   wherein the posture changing unit comprises:
   a posture changing treating bath having a storage space for storing the substrate and includes at least one of a first, second, or third treating liquid; and
   a posture changing robot configured to discharge the substrate immersed in liquid within the storage space one by one, change the posture of the substrate from the vertical posture to the horizontal posture, and transfer the substrate to a buffer unit,
   wherein the buffer unit is configured to store the substrate in the horizontal posture.

2. The substrate treating apparatus of claim 1, wherein the posture changing unit further comprises:
   a support member positioned within the storage space of the posture changing treating bath and which supports the substrate which has its posture changed by the posture changing robot in the vertical posture.

3. The substrate treating apparatus of claim 1, wherein the first process treating unit comprises:
   a liquid treating unit configured to treat the substrate in the single-type method by supplying a first treating liquid to the substrate in the horizontal posture; and
   the buffer unit configured to store the substrate which has been treated at the liquid treating unit in the horizontal posture.

4. The substrate treating apparatus of claim 3, wherein the posture changing robot transfers the substrate between the buffer unit and the posture changing treating bath, and the posture changing robot changes the substrate which is stored at the buffer unit in the horizontal posture to the vertical posture to transfer to the posture changing treating bath, and changes the substrate which is stored at the posture changing treating bath in the vertical posture to the horizontal posture to transfer to the buffer unit.

5. The substrate treating apparatus of claim 4, wherein the second process treating unit comprises:
   a plurality of batch-type treating baths for batch-type treating the substrate; and
   a transfer unit configured to transfer the substrate between the posture changing treating bath and the plurality of batch-type treating baths.

6. The substrate treating apparatus of claim 5, wherein the plurality of batch-type treating baths comprise:
   a first batch-type treating bath for batch-type treating the substrate by supplying a second treating liquid to the substrate; and
   a second batch-type treating bath for batch-type treating the substrate by supplying a third treating liquid to the substrate.

7. The substrate treating apparatus of claim 4, wherein the first process treating unit comprises:
   an organic solvent treating unit configured to single-type treat the substrate by supplying an organic solvent to the substrate;
   a supercritical treating unit configured to single-type treat the substrate by supplying a drying fluid to the substrate; and
   a transfer treating unit configured to transfer the substrate between the buffer unit, the liquid treating unit, the organic solvent treating unit, and the supercritical treating unit.

8. The substrate treating apparatus of claim 1, wherein the first process treating unit includes a load port unit configured to include a plurality of load ports, and
   a portion of the plurality of load ports are provided as a first load port unit at which the substrate is loaded in the horizontal posture, and
   the other portion of the plurality of load ports are provided as a second load port unit at which the substrate is unloaded in the horizontal posture.

9. The substrate treating apparatus of claim 1, wherein the posture changing robot comprises:
   a hand which is configured to hold the substrate; and
   an arm which moves the hand,
   wherein a surface of the substrate stored in the buffer unit remains in a wetted state.

10. The substrate treating apparatus of claim 1, further comprising a controller, and
    wherein the controller controls the substrate to sequentially perform:
    a substrate loading step for loading the substrate to the load port of the first process treating unit in the horizontal posture;
    a first single-type treating step for treating the substrate at the liquid treating unit of the first process treating unit in the horizontal posture;
    a first posture changing step for changing the posture of the substrate from the horizontal posture to the vertical posture;
    a batch-type treating step for treating the substrate at the second process treating unit in the vertical posture;
    a second posture changing step for changing the posture of the substrate from the vertical posture to the horizontal posture;

a second single-type treating step for treating the substrate at the first process treating unit in the horizontal posture; and a substrate unloading step for unloading the substrate to the load port of the first process treating unit in the horizontal posture.

11. A substrate treating apparatus comprising:

a first process treating unit configured to treat a substrate in a single-type method;

a second process treating unit configured to treat a plurality of substrates in a batch-type method;

a third process treating unit configured to treat the substrate in a single-type method;

a first posture changing unit provided between the first process treating unit and the second process treating unit and which is configured to change a posture of the substrate between a vertical posture and a horizontal posture; and a second posture changing unit provided between the second process treating unit and the third process treating unit and which is configured to change a posture of the substrate between the vertical posture and the horizontal posture, wherein the second process treating unit is provided between the first process treating unit and the third process treating unit, wherein the second process treating unit further comprises a transfer unit configured to transfer the plurality of substrates treated in the second process treating unit to the second posture changing unit, wherein the second posture changing unit comprises:

a second posture changing treating bath having a storage space for storing the substrate and includes at least one of a first, second, or third treating liquid; and a second posture changing robot configured to discharge the substrate immersed in liquid within the storage space one by one, change the posture of the substrate from the vertical posture to the horizontal posture, and transfer the substrate to a second buffer unit, wherein the second buffer unit is configured to store the substrate in the horizontal posture.

12. The substrate treating apparatus of claim 11, wherein the substrate is loaded to the first process treating unit, and the substrate is unloaded by the second process treating unit, and wherein a surface of the substrate stored in the second buffer unit remains in a wetted state.

13. The substrate treating apparatus of claim 11, wherein the first process treating unit comprises:

a first load port unit configured to include a plurality of load ports at which the substrate is loaded in the horizontal posture;

a liquid treating unit configured to single-type treat the substrate in the horizontal posture by supplying a first treating liquid to the substrate; and a first buffer unit configured to store a substrate which has been treated at the liquid treating unit in the horizontal posture, and wherein the third process treating unit comprises:

an organic solvent treating unit configured to single-type treat the substrate in the horizontal posture by supplying an organic solvent to the substrate;

a dry treating unit configured to single-type treat the substrate in the horizontal posture by supplying a drying fluid to the substrate; and a second buffer unit configured to store the substrate which has been single-type treated at the organic solvent treating unit and the dry treating unit in the horizontal posture.

14. The substrate treating apparatus of claim 13, wherein the first posture changing unit comprises:

a first posture changing robot for changing the posture of the substrate between the vertical posture and the horizontal posture;

a first posture changing treating bath having a storage space for storing the substrate, wherein the posture changing treating bath includes at least one of a first, second, or third treating liquid; and a first support member positioned within the storage space of the first posture changing treating bath and which supports the substrate which has its posture changed by the first posture changing robot in the vertical posture, wherein the first posture changing robot changes the substrate stored at the first buffer unit in the horizontal posture to the vertical posture to transfer to the first posture changing treating bath.

15. The substrate treating apparatus of claim 14, wherein the second posture changing unit further comprises:

a second support member positioned within the storage space of the second posture changing treating bath and which supports the substrate which has its posture changed by the second posture changing robot in the vertical posture.

16. The substrate treating apparatus of claim 15, wherein the second process treating unit comprises:

a plurality of batch-type treating baths for batch-type treating the substrate; and a transfer unit configured to transfer the substrate between the first posture changing treating bath, the second posture changing treating bath, and the plurality of batch-type treating baths, and wherein the plurality of batch-type treating baths comprise:

a first batch-type treating bath for batch-type treating the substrate by supplying a second treating liquid to the substate; and a second batch-type treating bath for batch-type treating the substrate by supplying a third treating liquid to the substrate.

17. The substrate treating apparatus of claim 11, wherein the first posture changing unit includes a first posture changing robot which changes the posture of the substrate from the horizontal posture to the vertical posture, and the second posture changing unit includes a second posture changing robot which changes the posture of the substrate from the vertical posture to the horizontal posture, and wherein the first posture changing robot and the second posture changing robot each comprise:

a hand which is configured to hold the substrate; and an arm which moves the hand.

18. The substrate treating apparatus of claim 11, further comprising a controller, and wherein the controller controls the substrate to sequentially perform:

a substrate loading step for loading the substrate to a load port of the first process treating unit in the horizontal posture;

a first single-type treating step for treating the substrate at the first process treating unit in the horizontal posture;

a first posture changing step for changing the posture of the substrate from the horizontal posture to the vertical posture;

a batch-type treating step for treating the substrate at the second process treating unit in the vertical posture;

a second posture changing step for changing the posture of the substrate from the vertical posture to the horizontal posture;

a second single-type treating step for treating the substrate at the third process treating unit in the horizontal posture; and a substrate unloading step for unloading the substrate to a load port of the third process treating unit in the horizontal posture.

19. The substrate treating apparatus of claim 1, wherein the vertical posture refers to a posture at which a top surface or a bottom surface of the substrate is parallel to a direction perpendicular to the ground, and the horizontal posture refers to a posture at which the top surface or the bottom surface of the substrate is parallel to the ground.

20. The substrate treating apparatus of claim 6, wherein the first treating liquid is a removing liquid for removing an oxide film on the substrate, the second treating liquid is a chemical for removing a contaminant remaining on the substrate, and the third treating liquid is a pure water.

* * * * *